(12) United States Patent
Hsiao

(10) Patent No.: US 10,565,053 B1
(45) Date of Patent: Feb. 18, 2020

(54) DATA READING METHOD, STORAGE CONTROLLER AND STORAGE DEVICE

(71) Applicant: Shenzhen EpoStar Electronics Limited CO., Shenzhen (CN)

(72) Inventor: Yu-Hua Hsiao, Hsinchu County (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 16/423,162

(22) Filed: May 28, 2019

(30) Foreign Application Priority Data

Mar. 28, 2019 (TW) .............................. 108110923 A

(51) Int. Cl.
| | |
|---|---|
| *G06F 11/10* | (2006.01) |
| *G11C 29/52* | (2006.01) |
| *H03M 13/45* | (2006.01) |
| *G11C 16/26* | (2006.01) |
| *H03M 13/37* | (2006.01) |
| *G11C 16/04* | (2006.01) |

(52) U.S. Cl.
CPC .......... *G06F 11/1068* (2013.01); *G11C 16/26* (2013.01); *G11C 29/52* (2013.01); *H03M 13/3746* (2013.01); *H03M 13/458* (2013.01); *G11C 16/0483* (2013.01)

(58) Field of Classification Search
CPC ............... G06F 11/076; G06F 11/0727; G06F 11/1012; G06F 11/1048
See application file for complete search history.

(56) References Cited

U.S. PATENT DOCUMENTS

| | | | | |
|---|---|---|---|---|
| 2012/0224421 | A1* | 9/2012 | Litsyn .................... | G11C 16/08 365/185.03 |
| 2015/0220391 | A1* | 8/2015 | Chilappagari ...... | G06F 11/1048 714/764 |
| 2018/0189125 | A1* | 7/2018 | Karlik ................. | G06F 11/1048 |
| 2018/0374549 | A1* | 12/2018 | Padilla ............... | G11C 16/3427 |

* cited by examiner

*Primary Examiner* — Jigar P Patel
(74) *Attorney, Agent, or Firm* — JCIPRNET

(57) ABSTRACT

A memory management method is provided. The method includes: using a preset read voltage, a left preset read voltage set and a right preset read voltage set corresponding to the preset read voltage to perform a read operation on a target codeword to obtain a hard bit codeword, a left bit codeword and a right bit codeword, respectively; performing iterative decoding operations on each of the hard bit codeword, the left bit codeword and the right bit codeword to identify a trust codeword having a smallest syndrome among the hard bit codeword, the left bit codeword and the right bit codeword; using the hard bit codeword, the left bit codeword, the right bit codeword and the trust codeword to perform a calibration on a log-likelihood ratio table of the iterative operations, so as to update the log-likelihood ratio table to a calibrated log-likelihood ratio table.

17 Claims, 10 Drawing Sheets

|  | $SI_1$ | $SI_2$ | $SI_3$ | $SI_4$ | $SI_5$ | $SI_6$ |
|---|---|---|---|---|---|---|
|  | 1 | 2 | 3 | 4 | 5 | 6 |
| Total number of bit values "0" belonging to corresponding soft information index in trust codeword: | 5 | 6 | 9 | 72 | 309 | 18031 |
| Total number of bit values "1" belonging to corresponding soft information index in trust codeword: | 17497 | 230 | 208 | 189 | 124 | 184 |
| Total number of memory cells belonging to soft information index: | 17502 | 236 | 217 | 261 | 433 | 18215 |
| Log-likelihood ratios belonging to soft information index: | −8 | −4 | −3 | −1 | 1 | 5 |

Calibrated log-likelihood ratio table corresponding to target physical page — 600

DATA READING METHOD, STORAGE CONTROLLER AND STORAGE DEVICE

CROSS-REFERENCE TO RELATED APPLICATION

This application claims the priority benefit of Taiwan application serial no. 108110923, filed on Mar. 28, 2019. The entirety of the above-mentioned patent application is hereby incorporated by reference herein and made a part of this specification.

BACKGROUND

Technical Field

The invention relates to a data reading method, and more particularly, to a data reading method adapted to a storage device disposed with a rewritable non-volatile memory module and a storage controller thereof.

Description of Related Art

In general, when an iterative decoding operation (e.g., a low density parity check code decoding operation) performed on a codeword read from a physical page of the rewritable non-volatile memory module fails, the storage controller of the memory device will try to correct a log-likelihood ratio table of the iterative decoding operation according to verified data (e.g., known data pre-stored in the rewritable non-volatile memory module), so as to perform the iterative decoding operation on the read codeword again by using a calibrated log-likelihood ratio table.

However, the conventional method needs to additionally prepare the known verified data (i.e., by storing the known verified data into a plurality of word lines of the rewritable non-volatile memory module). Since the conventional method needs to use a spare space of the rewritable non-volatile memory module to store the verified data, a remaining available space of the rewritable non-volatile memory module is reduced accordingly. Consequently, an operational efficiency of the storage device is reduced due to the reduced remaining available space (because many of management operations in the storage device will require the use of the remaining available space).

Therefore, how to efficiently calibrate the log likelihood ratio table corresponding to the iterative decoding operation without preparing the verified data to overcome the defects in the conventional method, improve a performance of the decoding operation, and improve a data reading efficiency of the rewritable non-volatile memory module is one of issues to be addressed by persons skilled in art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a data reading method, a storage controller and a storage device, which are capable of calibrating the log-likelihood ratio table of the iterative decoding operation by using soft information corresponding to a codeword stored by a specific physical page without preparing the verified data, so as to improve a correct rate of the decoding operation performed on the codeword stored by the specific physical page. Accordingly, the efficiency of the read operation on the codeword may be improved. Here, the codeword is not the preset data or the known verified data.

An embodiment of the invention provides a data reading method adapted to a storage device disposed with a rewritable non-volatile memory module. The rewritable non-volatile memory module has a plurality of word lines. Each word line among the word lines is coupled to a plurality of memory cells. Each memory cell among the memory cells includes a plurality of physical pages, and each physical page among the physical pages is configured to be programmed as a bit value. The method includes: using a preset read voltage to perform a read operation on a target codeword stored by a target physical page of a target word line to obtain a hard bit codeword, wherein the hard bit codeword is stored into a hard bit buffer area, wherein a plurality of target memory cells of the target physical page are configured to store a plurality of target bit values of the target codeword, respectively; performing an iterative decoding operation on the hard bit codeword to obtain a decoded hard bit codeword corresponding to the hard bit codeword and a hard bit syndrome corresponding to the decoded hard bit codeword, wherein in response to determining that the hard bit syndrome is a smallest syndrome, the decoded hard bit codeword and the hard bit syndrome are stored into a trust buffer area to become a trust codeword and a trust syndrome; in response to a plurality of bit values of the trust syndrome not all being zero, performing steps of: using a left preset read voltage set and a right preset read voltage set corresponding to the preset read voltage to read the target codeword to obtain a left bit codeword, a right bit codeword, and a soft bit codeword corresponding to the left bit codeword and the right bit codeword, respectively, wherein the soft bit codeword is stored into a soft bit buffer area; performing the iterative decoding operation on each of the left bit codeword and the right bit codeword to obtain a decoded left bit codeword corresponding to the left bit codeword, a left bit syndrome corresponding to the decoded left bit codeword, a decoded right bit codeword corresponding to the right bit codeword and a right bit syndrome corresponding to the decoded right bit codeword, using the hard bit codeword and the soft bit codeword to compose soft information corresponding to the target codeword, and using the soft information and the trust codeword to perform a calibration on a log-likelihood ratio table of the iterative decoding operation, so as to update the log-likelihood ratio table into a calibrated log-likelihood ratio table; and performing the iterative decoding operation on the soft information according to the calibrated log-likelihood ratio table to obtain a final decoded codeword corresponding to the read operation and thereby complete the read operation, wherein a plurality of bit values of the final decoded codeword are configured to represent the plurality of target bit values of the stored target codeword.

An embodiment of the invention provides a storage controller, which is configured to control a storage device having a rewritable non-volatile memory module. The storage controller includes a connection interface circuit, a memory interface control circuit, a read assisting circuit unit and a processor. The connection interface circuit is configured to couple to a host system. The memory interface control circuit is configured to couple to the rewritable non-volatile memory module. The rewritable non-volatile memory module has a plurality of word lines. Each word line among the word lines is coupled to a plurality of memory cells. Each memory cell among the memory cells includes a plurality of physical pages, and each physical page among the physical pages is configured to be programmed as a bit value. The processor is coupled to the connection interface circuit, the memory interface control circuit, the read assisting circuit unit and the error checking and correcting circuit. The processor is configured to select a target word line among the plurality of word lines of the rewritable non-volatile memory module, and select a target physical page in the target word line. The read assisting circuit unit is configured to use a preset read voltage to perform a read operation on a target codeword stored by the target physical page to obtain a hard bit codeword. The hard bit codeword is stored into a hard bit buffer area. A plurality of target memory cells of the target physical page are configured to store a plurality of target bit values of the target codeword, respectively. The error checking and correcting circuit is further configured to perform an iterative decoding operation on the hard bit codeword to obtain a decoded hard bit codeword corresponding to the hard bit codeword and a hard bit syndrome corresponding to the decoded hard bit codeword. In response to determining that the hard bit syndrome is a smallest syndrome, the decoded hard bit codeword and the hard bit syndrome are stored into a trust buffer area of the read assisting circuit unit by the error checking and correcting circuit to become a trust codeword and a trust syndrome. Further, in response to the plurality of bit values of the trust syndrome not all being zero, the read operation further includes the following operations. The read assisting circuit unit is configured to use a left preset read voltage set and a right preset read voltage set corresponding to the preset read voltage to read the target codeword to obtain a left bit codeword, a right bit codeword, and a soft bit codeword corresponding to the left bit codeword and the right bit codeword, respectively, wherein the soft bit codeword is stored into a soft bit buffer area of the read assisting circuit unit. The error checking and correcting circuit is configured to perform the iterative decoding operation on each of the left bit codeword and the right bit codeword to obtain a decoded left bit codeword corresponding to the left bit codeword, a left bit syndrome corresponding to the decoded left bit codeword, a decoded right bit codeword corresponding to the right bit codeword and a right bit syndrome corresponding to the decoded right bit codeword. The read assisting circuit unit is configured to use the hard bit codeword and the soft bit codeword to compose soft information corresponding to the target codeword, and use the soft information and the trust codeword to perform a calibration on a log-likelihood ratio table of the iterative decoding operation, so as to update the log-likelihood ratio table into a calibrated log-likelihood ratio table. The error checking and correcting circuit is further configured to perform the iterative decoding operation on the soft information according to the calibrated log-likelihood ratio table to obtain a final decoded codeword corresponding to the read operation and thereby complete the read operation, wherein a plurality of bit values of the final decoded codeword are configured to represent the plurality of target bit values of the stored target codeword.

An embodiment of the invention provides a storage device. The storage device includes a rewritable non-volatile memory module, a memory interface control circuit and a processor. The rewritable non-volatile memory module has a plurality of word lines. Each word line among the word lines is coupled to a plurality of memory cells. Each memory cell among the memory cells includes a plurality of physical pages, and each physical page among the physical pages is configured to be programmed as a bit value. The memory interface control circuit is configured to couple to the rewritable non-volatile memory module. The processor is coupled to the memory interface control circuit. The processor loads in and executes a read assisting program code module to realize a data reading method. The data reading method includes: using a preset read voltage to perform a read operation on a target codeword stored by a target physical page of a target word line to obtain a hard bit codeword, wherein the hard bit codeword is stored into a hard bit buffer area, wherein a plurality of target memory cells of the target physical page are configured to store a plurality of target bit values of the target codeword, respectively, wherein the target word line is selected from the plurality of word lines of the rewritable non-volatile memory module; performing an iterative decoding operation on the hard bit codeword to obtain a decoded hard bit codeword corresponding to the hard bit codeword and a hard bit syndrome corresponding to the decoded hard bit codeword, wherein in response to determining that the hard bit syndrome is a smallest syndrome, the decoded hard bit codeword and the hard bit syndrome are stored into a trust buffer area to become a trust codeword and a trust syndrome; in response to a plurality of bit values of the trust syndrome not all being zero, performing steps of: using a left preset read voltage set and a right preset read voltage set corresponding to the preset read voltage to read the target codeword to obtain a left bit codeword, a right bit codeword, and a soft bit codeword corresponding to the left bit codeword and the right bit codeword, respectively, wherein the soft bit codeword is stored into a soft bit buffer area; performing the iterative decoding operation on each of the left bit codeword and the right bit codeword to obtain a decoded left bit codeword corresponding to the left bit codeword, a left bit syndrome corresponding to the decoded left bit codeword, a decoded right bit codeword corresponding to the right bit codeword and a right bit syndrome corresponding to the decoded right bit codeword, using the hard bit codeword and the soft bit codeword to compose soft information corresponding to the target codeword, and using the soft information and the trust codeword to perform a calibration on a log-likelihood ratio table of the iterative decoding operation, so as to update the log-likelihood ratio table into a calibrated log-likelihood ratio table; and performing the iterative decoding operation on the soft information according to the calibrated log-likelihood ratio table to obtain a final decoded codeword corresponding to the read operation and thereby complete the read operation, wherein a plurality of bit values of the final decoded codeword are configured to represent the plurality of target bit values of the stored target codeword.

Based on the above, the data reading method, the storage controller and the storage device provided by the embodiments of the invention can execute the read assisting operation corresponding to the target physical page of the target word line on any programmed target word line without preparing the verified data. In the read assisting operation, the log-likelihood ratio table of the iterative decoding operation may be calibrated by using the soft information corresponding to the codeword stored by the specific physical page (the codeword is neither the preset data or the known verified data) and the trust codeword having the smallest syndrome corresponding to the codeword without preparing the verified data, so as to improve the correct rate of the decoding operation performed on the codeword stored by the specific physical page. As a result, the correct rate and the reliability of the data read form the target word line may be improved to reduce the loading of the decoding operation performed on the read data and thereby improve the overall efficiency of the data reading operation.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6 is a schematic diagram illustrating how a plurality of log-likelihood ratios of a calibrated log-likelihood ratio table are calculated based on a trust codeword according to an embodiment of the invention.

DESCRIPTION OF THE EMBODIMENTS

Figure 1A:
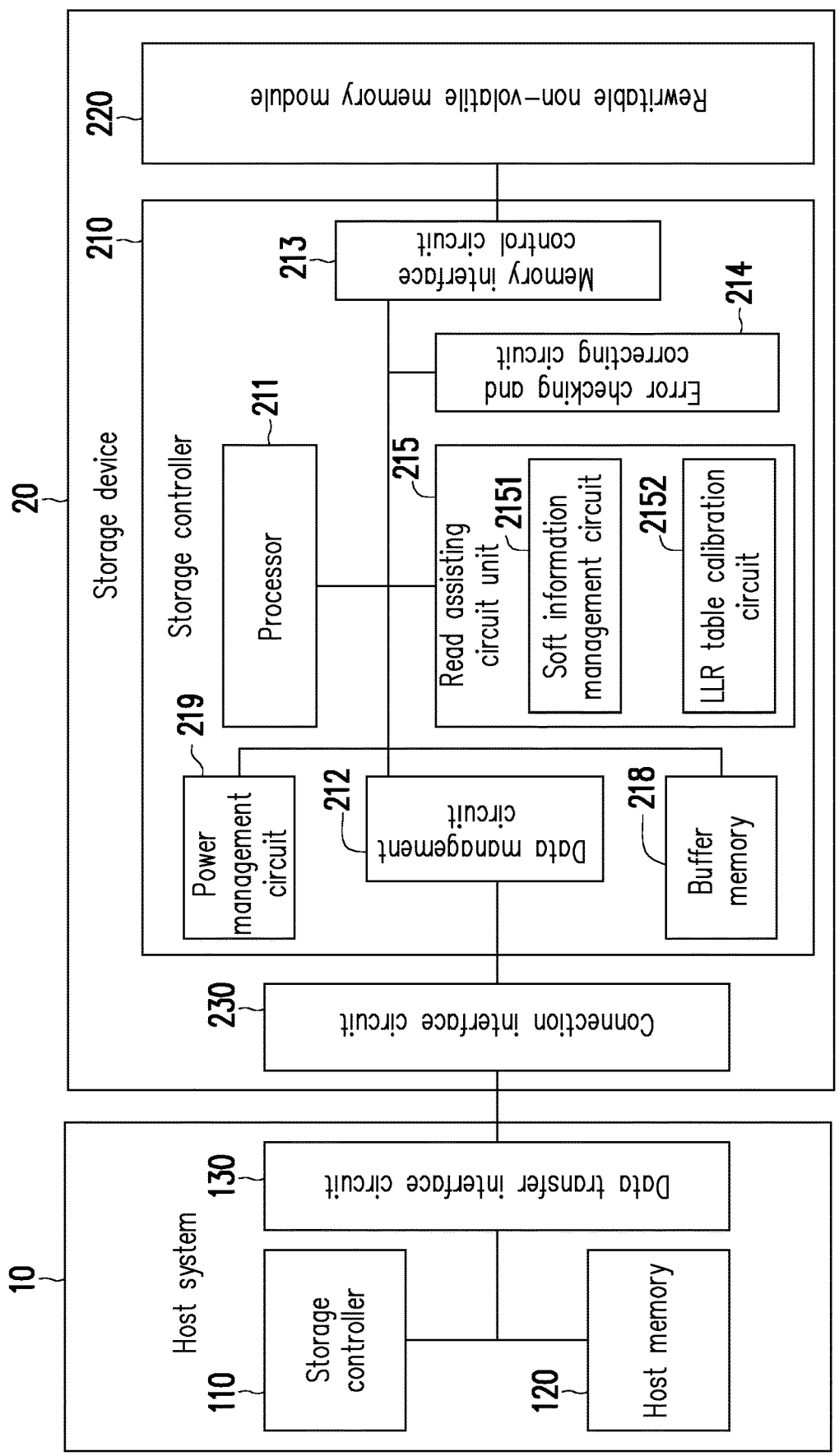
FIG. 1A is a block diagram illustrating a host system and a storage device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In the present embodiment, a storage device includes a rewritable non-volatile memory module and a storage device controller (a.k.a. a storage controller or a storage control circuit). Also, the storage device is usually used together with a host system so the host system can write data into or read data from the storage device.

FIG. 1A is a block diagram illustrating a host system and a storage device according to an embodiment of the invention.

With reference to FIG. 1A a host system 10 includes a processor 110, a host memory 120 and a data transfer interface circuit 130. In this embodiment, the data transfer interface circuit 130 is coupled (or, electrically connected) to the processor 110 and the host memory 120. In another embodiment, the processor 110, the host memory 120 and the data transfer interface circuit 130 are coupled to one another by utilizing a system bus.

A storage device 20 includes a storage controller 210, a rewritable non-volatile memory module 220 and a connection interface circuit 230. Among them, the storage controller 210 includes a processor 211, a data management circuit 212 and a memory interface control circuit 213.

In this embodiment, the host system 10 is coupled to the storage device 20 through the data transfer interface circuit 130 and the connection interface circuit 230 of the storage device 20 to perform a data accessing operation. For example, the host system 10 can store data to the storage device 20 or read data from the storage device 20 through the data transfer interface circuit 130.

In the present embodiment, the processor 110, the host memory 120 and the data transfer interface circuit 130 may be disposed on a main board of the host system 10. The number of the data transfer interface circuit 130 may be one or more. Through the data transfer interface circuit 130, the main board may be coupled to the storage device 20 in a wired manner or a wireless manner. The storage device 20 may be, for example, a flash drive, a memory card, a solid state drive (SSD) or a wireless memory storage device. The wireless memory storage device may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board may also be coupled to various I/O devices including a GPS (Global Positioning System) module, a network interface card, a wireless transmission device, a keyboard, a monitor and a speaker through the system bus.

In the present embodiment, the data transfer interface circuit 130 and the connection interface circuit 230 are an interface circuit compatible with a Peripheral Component Interconnect Express (PCI Express) interface standard. Further, a data transfer is performed between the data transfer interface circuit 130 and the connection interface circuit 230 by using a communication protocol of a Non-Volatile Memory express (NVMe) interface standard.

Nevertheless, it should be understood that the invention is not limited in this regard. The data transfer interface circuit 130 and the connection interface circuit 230 may also be compatible to a PATA (Parallel Advanced Technology Attachment) standard, an IEEE (Institute of Electrical and Electronic Engineers) 1394 standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. Further, in another embodiment, the connection interface circuit 230 and the storage controller 210 may be packaged into one chip, or the connection interface circuit 230 is distributed outside a chip containing the storage controller 210.

In this embodiment, the host memory 120 is configured to temporarily store commands executed by the processor 110 or data. For instance, in the present exemplary embodiment, the host memory 120 may be a Dynamic Random Access Memory (DRAM), or a Static Random Access Memory (SRAM) and the like. Nevertheless, it should be understood that the invention is not limited thereto, and the host memory 120 may also be other appropriate memories.

The storage unit 210 is configured to execute a plurality of logic gates or control commands, which are implemented in a hardware form or in a firmware form, and to perform operations of writing, reading or erasing data in the rewritable non-volatile memory storage module 220 according to the commands of the host system 10.

More specifically, the processor 211 in the storage controller 210 is a hardware with computing capabilities, which is configured to control overall operation of the storage controller 210. Specifically, the processor 211 has a plurality of control commands and the control commands are executed to perform various operations such as writing, reading and erasing data during operation of the storage device 20.

It is noted that, in this embodiment, the processor 110 and the processor 211 are, for example, a central processing unit (CPU), a micro-processor, other programmable microprocessors, a digital signal processor (DSP), a programmable controller, an application specific integrated circuits (ASIC), a programmable logic device (PLD) or other similar circuit elements, which are not particularly limited by the invention.

In an embodiment, the storage controller 210 further includes a ROM (not illustrated) and a RAM (not illustrated). More particularly, the ROM has a boot code, which is executed by the processor 221 to load the control commands stored in the rewritable non-volatile memory module 220 into the RAM of the storage controller 210 when the storage controller 210 is enabled. Then, the control commands are executed by the processor 211 to perform operations, such as writing, reading or erasing data. In another embodiment, the control commands of the processor 211 may also be stored as program codes in a specific area (for example, physical storage units in the rewritable non-volatile memory module 220 dedicated for storing system data) of the rewritable non-volatile memory module 220.

In this embodiment, as described above, the storage controller 210 further includes the data management circuit 212 and the memory interface control circuit 213. It should be noted that, operations performed by each part of the storage controller 210 may also be considered as operations performed by the storage controller 210.

The data management circuit 212 is coupled to the processor 211, the memory interface control circuit 213 and the connection interface circuit 230. The data management circuit 212 is configured to transmit data under instruction of the processor 211. For example, the data may be read from the host system 10 (e.g., the host memory 120) through the connection interface circuit 230, and the read data may be written into the rewritable non-volatile memory module 220 through the memory interface control circuit 213 (e.g., a writing operation performed according to the write command from the host system 10). As another example, the data may be read from one or more physical units of the rewritable non-volatile memory module 220 through the memory interface control circuit 213 (the data may be read from one or more memory cells in one or more physical units), and the read data may be written into the host system 10 (e.g., the host memory 120) through the connection interface circuit 230 (e.g., a read operation performed according to a read command from the host system 10). In another embodiment, the data management circuit 212 may also be integrated into the processor 211.

The memory interface control circuit 213 is configured to receives instructions of the processor 211, and perform write (or, programming) operation, read operation and erase operation for the rewritable non-volatile memory module 220 together with the data management circuit 212.

For instance, the processor 211 can execute a write command sequence to instruct the memory interface control circuit 213 to write the data into the rewritable non-volatile memory module 220; the processor 211 can execute a read command sequence to instruct the memory interface control circuit 213 to read the data from one or more physical units (a.k.a. target physical units) corresponding to the read command in the rewritable non-volatile memory module 220; the processor 211 can execute an erase command sequence to instruct the memory interface control circuit 213 to perform the erasing operation for the rewritable non-volatile memory module 220. Each of the write command sequence, the read command sequence and the erase command sequence may include one or more program codes or command codes, respectively, and instruct the rewritable non-volatile memory module 220 to perform the corresponding operations, such as writing, reading and erasing. In an embodiment, the processor 211 can further give other command sequences to the memory interface control circuit 213 so as to perform the corresponding operations for the rewritable non-volatile memory module 220.

In addition, data to be written to the rewritable non-volatile memory module 220 is converted into a format acceptable by the rewritable non-volatile memory module 220 through the memory interface control circuit 213. Specifically, when the processor 211 attempts to access the rewritable non-volatile memory module 220, the processor 211 sends the corresponding command sequences to the memory interface control circuit 213 in order to instruct the memory interface control circuit 213 to perform the corresponding operations. For example, the command sequences may include the write command sequence as an instruction for writing data, the read command sequence as an instruction for reading data, the erase command sequence as an instruction for erasing data, and other corresponding command sequences as instructions for various memory operations (e.g., changing a plurality of preset read voltage values of a preset read voltage set to perform the read operation or a read assisting operation, or performing a garbage collection procedure). The command sequences may include one or more signals, or data transmitted in the bus. The signals or the data may include command codes and program codes. For example, information such as identification codes and memory addresses are included in the read command sequence.

The rewritable non-volatile memory module 220 is coupled to the storage controller 210 (the memory control circuit unit 213) and configured to store data written from the host system 10. The rewritable non-volatile memory module 220 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quadruple Level Cell) NAND flash memory module (i.e., a flash memory module capable of storing four bits in one memory cell), a 3D NAND flash memory module or a vertical NAND flash memory module, a vertical NAND flash memory module or a vertical NAND flash memory module other flash memory modules or any memory module having the same features. The memory cells in the rewritable non-volatile memory module 220 are disposed in an array.

In this embodiment, the rewritable non-volatile memory module 220 has a plurality of word lines, wherein each word line among the word lines is coupled to a plurality of memory cells. The memory cells on the same word line compose one or more physical programming units. In addition, a plurality of physical programming units can compose one physical unit (a physical block or a physical erasing unit). In this embodiment, the TLC (Triple Level Cell) NAND flash memory is taken as an example. That is to say, in the following embodiment, one memory cell capable of storing three bit values is used as one physical programming unit (i.e., in each programming operation, the data is programmed by applying a programming voltage one by one on the physical programming units). Here, each memory cell may be grouped into a lower physical page, a middle physical page and an upper physical page.

In this embodiment, the memory cell is used as a minimum unit for writing (programming) data. The physical unit is a minimum unit for erasing (i.e., each physical unit includes a minimum number of memory cells to be erased together).

The following embodiments are provided with a TLC NAND flash memory module as an example, in which the read assisting operation in page-level is performed for a specific physical page (by performing the read assisting operation on a plurality of memory cells included by the specific physical page) of a specific word line in the TLC NAND flash memory module (e.g., one of the lower physical page, the middle physical page and the upper physical page). A data reading method used by the read assisting operation is also described as follows. Nonetheless, the read assisting operation in page-level and the data reading method provided by this embodiment are also applicable to other types of flash memory modules.

The storage controller 210 assigns a plurality of logical units for the rewritable non-volatile memory module 220. The host system 10 accesses user data stored in a plurality of physical units through the assigned logical units. Here, each of the logical units may be composed of one or more logical addresses. For example, the logical unit may be a logical block, a logical page, or a logical sector. One logical unit may be mapped to one or more physical units, where the physical unit may be one or more physical addresses, one or more physical sectors, one or more physical programming units, or one or more physical erasing units. In the present embodiment, the logical unit is a logical block, and the logical sub-unit is a logical page. Each logical unit includes a plurality of logical sub-units.

For instance, the storage controller 210 can create a logical to physical address mapping table and a physical to logical address mapping table for recording a mapping relation between the logical units (e.g., the logical blocks, the logical pages or the logical sectors) assigned to the rewritable non-volatile memory module 220 and the physical units (e.g., the physical erasing units, the physical programming units or the physical sectors). In other words, the storage controller 210 can search for the physical unit mapped to one logical unit by using the logical to physical address mapping table, and the storage controller 210 can search for the logical unit mapped to one physical unit by using the physical to logical address mapping table. Nonetheless, the technical concept for the mapping relation between the logical units and the physical units is a well-known technical means in the field and is not a technical solution to be described in the invention.

In this embodiment, the error checking and correcting circuit 214 is coupled to the processor 211 and configured to execute an error checking and correcting procedure to ensure correctness of data. Specifically, when the processor 211 receives the write command from the host system 10, the error checking and correcting circuit 214 generates an ECC (error correcting code) and/or an EDC (error detecting code) for data corresponding to the write command, and the processor 211 writes data corresponding to the write command and the corresponding ECC and/or the EDC into the rewritable non-volatile memory module 220. Then, when the processor 211 reads the data from the rewritable non-volatile memory module 220, the ECC and/or the EDC corresponding to the data are also read, and the error checking and correcting circuit 214 performs the error checking and correcting procedure on the read data based on the ECC and/or the EDC. In addition, after the error checking and correcting procedure is completed, if the read data is successfully decoded, the error checking and correcting circuit 214 can transmit an error bit count back to the processor 211.

In this embodiment, an iterative decoding operation performed by the error checking and correcting circuit 214 adopts a low density parity code (LDPC) algorithm. Specifically, after receiving a codeword to be decoded (a.k.a. a target codeword or an original codeword), the error checking and correcting circuit 214 starts to perform the iterative decoding operation on the received codeword, identify a plurality of data bits of the codeword, check a corresponding table log-likelihood ratio table (a.k.a. LLR table) according to the data bits to obtain a plurality of log likelihood ratios corresponding to the data bits, and perform one iterative decoding operation on the codeword according to the log likelihood ratios.

In this embodiment, each time when the error checking and correcting circuit 214 completes one iterative decoding operation performed on one codeword, the error checking and correcting circuit 214 can obtain a decoded codeword and a syndrome corresponding to the decoded codeword. The error checking and correcting circuit 214 can determine whether the iterative decoding operation currently performed is successful or failed according to the syndrome.

If the decoding is failed, the error checking and correcting circuit 214 can determine whether one or more subsequent iterative operations need to be performed again according to a total number of the iterative decoding operations performed on the codeword being counted and a preset iteration count threshold. If the total number is greater than the preset iteration count threshold, the error checking and correcting circuit 214 determines that an overall decoding operation (the overall decoding operation may include one or more iterative decoding operations) for the codeword is failed, and outputs the last decoded codeword obtained and the corresponding syndrome; If the total number is not greater than the preset iteration count threshold, the error checking and correcting circuit 214 uses the decoded codeword obtained and the corresponding syndrome to re-perform the next iterative decoding operation. Based on demands, manufacturers can set the preset iteration count threshold, which is not particularly limited in the invention.

Each time (each round) in the end of the iterative decoding operation, the error checking and correcting circuit 214 calculates the syndrome corresponding to the last decoded codeword currently obtained, so as to determine whether the iterative decoding operation is successful this time. If the decoding is successful (the codeword generated after the decoding is correct, i.e., a valid codeword), the current iterative operation is ended, and the overall decoding operation for the codeword is also ended; if the decoding is failed (the codeword generated after the decoding is incorrect, i.e., an invalid codeword) and the total number is not greater than the preset iteration count threshold, the current iterative operation is ended and one new (the next) iterative operation is then started.

More specifically, in each iterative decoding operation, the error checking and correcting circuit 214 determines whether a plurality of bit values of the syndrome corresponding to the decoded codeword are all zero. If the bit values of the syndrome are all zero (i.e., "0"), the error checking and correcting circuit 214 determines that the decoded codeword is correct, completes the current iterative decoding operation and completes the overall decoding operation corresponding to the codeword. On the other hand, if the bit values of the syndrome are not all zero (i.e., having one or more "1"), the error checking and correcting circuit 214 determines that the decoded codeword is incorrect, completes the current iterative decoding operation, completes the overall decoding operation, and outputs the decoded codeword. It should be noted that, the above description is only used to explain the correspondence between the original codeword, the decoded codeword and the corresponding syndrome. Other details regarding the iterative decoding operation, the original codeword, the syndrome and the decoded codeword in the low-density parity check code algorithm are not the technical solutions of this invention, and thus are not described herein.

In an embodiment, the storage controller 210 further includes a buffer memory 218 and a power management circuit 219. The buffer memory is coupled to the processor 211 and configured to temporarily store data and commands from the host system 10, data from the rewritable non-volatile memory module 220 or other system data (e.g., the log-likelihood ratio table) for managing the storage device 20 so the processor 211 can rapidly access the data, the commands or the system data from the buffer memory 218. The power management circuit 219 is coupled to the processor 211 and configured to control power of the storage device 20.

In this embodiment, a read assisting circuit unit 215 includes a soft information management circuit 2151 and an LLR table calibration circuit 2152. The read assisting circuit unit 215 is configured to perform a read assisting operation on a specific physical page among a plurality of word lines. More specifically, at a specific time point, the processor 211 can select one word line (a.k.a. a target word line) among the word lines belonging to a plurality of physical units of the rewritable non-volatile memory module 220 and a specific physical page (a.k.a. a target physical page) of the target word line, and instruct the read assisting circuit unit 215 to perform the read assisting operation on the target physical page of the target word line.

For instance, the specific time point includes, but not limited to: (1) when the decoding operation is failed; (2) when the read operation is performed on the physical page of the word line with a poorer physical state (e.g., a word line with higher erase count, higher read count, longer retention time or higher error bit count); or (3) when the number of error bits of data read from one word line exceeds an error bit amount threshold.

Specifically, when the error bit count of the data read from one physical page corresponding to one word line exceeds the error bit count threshold, the word line is selected as the target word line and the physical page is selected as the target physical page. It should be noted that, the selected target word line is already stored with data, i.e., programmed with data. In this embodiment, the already stored data is not the known data preset by manufacturers or the system or the verified data (e.g., the already stored data is the user data).

In this embodiment, the soft information management circuit 2151 can perform a soft information operation on the specific physical page (e.g., the target physical page) to obtain soft information. Before describing the soft information operation, the concept of storage state needs to be explained first. In this embodiment, as described above, the target word line is stored with data. Specifically, the memory cells of each of the word lines are configured to be programmed to store a bit value corresponding to one of a plurality of different gray codes, and a total number of the gray codes is P. P is a first predetermined positive integer greater than 2, and a value of P may be set in advance according to a type of the rewritable non-volatile memory module 220. For example, if the rewritable non-volatile memory module 220 is the MLC, P=4; if the rewritable non-volatile memory module 220 is the SLC, P=2; if the rewritable non-volatile memory module 220 is the QLC, P=16.

For descriptive convenience, the present embodiment takes the TLC NAND flash memory module as an example, in which the memory cells of the target word line can store the bit values respectively corresponding to 8 gray codes (P=8). Details regarding the gray codes are described below with reference to FIG. 3A.

Figure 3A:
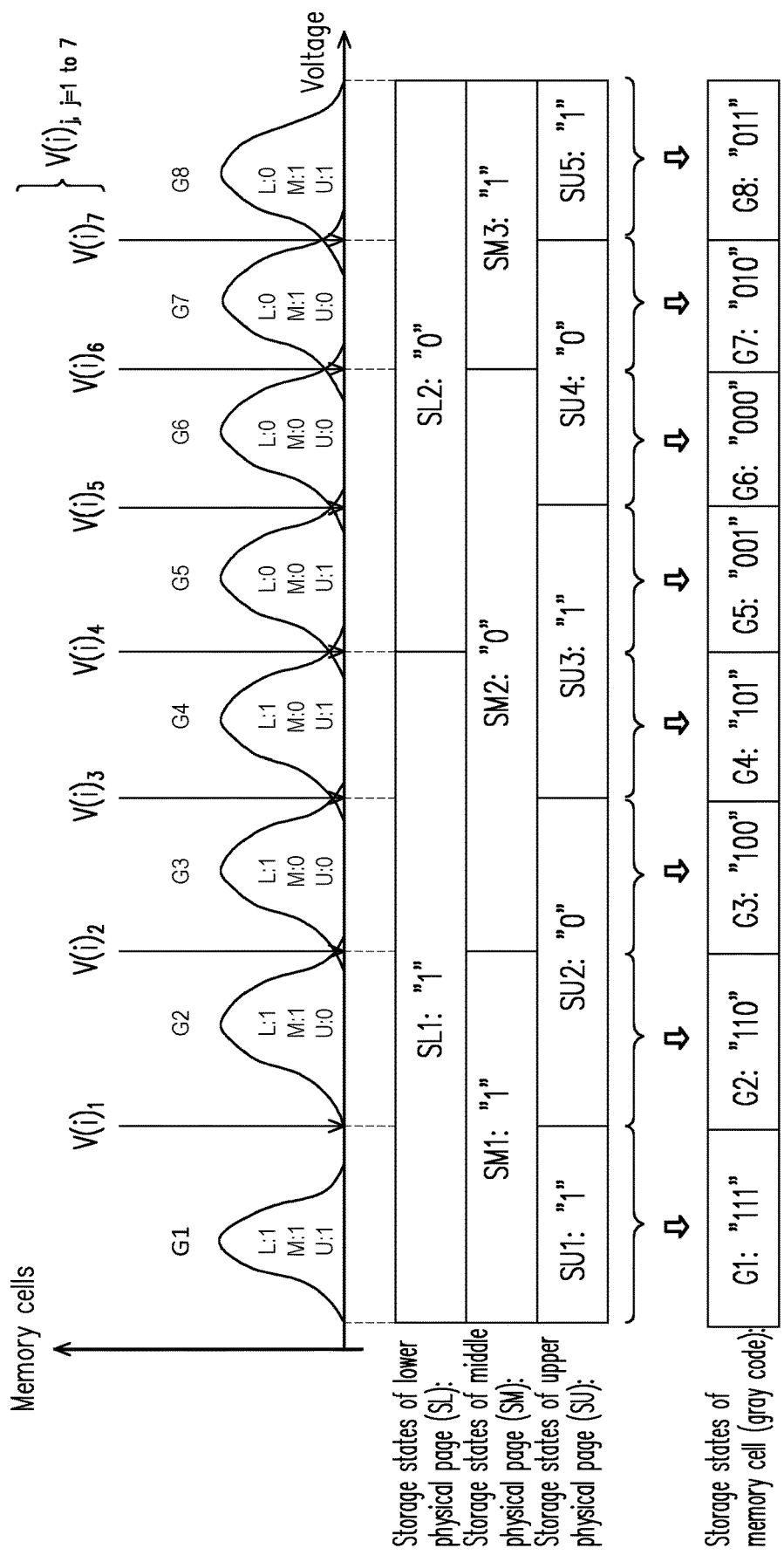
FIG. 3A is a schematic diagram illustrating threshold voltage distributions of a plurality of memory cells corresponding to P gray codes read through a read voltage set and storage states of the corresponding physical page according to an embodiment of the invention.

FIG. 3A is a schematic diagram illustrating threshold voltage distributions of a plurality of memory cells corresponding to P gray codes read through a read voltage set and storage states of the corresponding physical page according to an embodiment of the invention. Since this embodiment takes the TLC NAND flash memory module as an example of the rewritable non-volatile memory module 220, P is equal to 8 (i.e., $2^3$). Each memory cell of the TLC NAND flash memory module has three physical pages for storing bit data, respectively, and each memory cell includes the lower physical page (L), the middle physical page (M) and the upper physical page (U), each of which is capable of storing one bit value. It is assumed that, the processor 211 reads a plurality of memory cells (a plurality of target memory cells) of the target word line of the TLC NAND flash memory module through a plurality of read voltages $V(i)_1$ to $V(i)_7$ in a read voltage set $V(i)$, and accordingly identifies the different bit values stored by the memory cells (the bit values respectively corresponding to the different gray codes). According to the preset read voltages $V(i)_1$ to $V(i)_7$ in the read voltage set $V(i)$ (e.g., the preset read voltage set with the corresponding i equal to 1), a gate voltage in each memory cell may be divided into 8 gray codes, such as "L:1 M:1 U:1", "L:1 M:1 U:0", "L:1 M:0 U:0", "L:1 M:0 U:1", "L:0 M:0 U:1", "L:0 M:0 U:0", "L:0 M:1 U:0" and "L:0 M:1 U:1" ("L:" indicates the bit value of the lower physical page; "M:" indicates the bit value of the middle physical page; "U:" indicates the bit value of the upper physical page). The 8 gray codes may also be expressed by 8 bit value combinations, including "111", "110", "100", "101", "001", "000", "010" and "011". Here, an order of the bit values in each bit value combination is based on an order of the lower, middle and upper physical pages in that sequence. In other words, by applying the read voltages $V(i)_1$ to $V(i)_7$ with different voltage values in the read voltage set $V(i)$ to one memory cell of the target word line, the processor 211 can determine the bit value stored by that memory cell (a.k.a. bit data or a read bit value) corresponding to one of the gray codes ("111", "110", "100", "101", "001", "000", "010" and "011") according to whether a channel of that memory cell is turned on (i.e., using the read voltage set $V(i)$ to read the read bit value from the one memory of the target word line). It should be noted that, based on the number of the gray codes that can be included by the memory cell of the rewritable non-volatile memory module 220 (which is 8 in this example), the number of the read voltages in each read voltage set is the number of the gray codes minus one (which is 7 in this example, i.e., N−1=8−1=7).

More specifically, the gray code stored by one memory may be formed by storage states of the lower physical page (SL), storage states of the middle physical page (SM) and storage states of the upper physical page (SU) in that sequence (as shown by multiple arrows in FIG. 3A).

In this embodiment, the preset read voltage $V(i)_4$ is configured to divide storage states SL1 ("1") and SL2 ("0") of the lower physical page; the preset read voltages $V(i)_2$ and $V(i)_6$ are configured to divide storage states SM1 ("1"), SM2 ("0") and SM3 ("1") of the middle physical page; the preset read voltages $V(i)_1$, $V(i)_3$, $V(i)_5$ and $V(i)_7$ are configured to divide storage states SU1 ("1"), SU2 ("0"), SU3 ("1"), SU4 ("0") and SU5 ("1") of the upper physical page.

The processor 211 (or the read assisting circuit unit 215) can use the preset read voltages corresponding to the lower physical page, the middle physical page and the upper physical page in the preset read voltage set to read the word line in sequence, so as to obtain the storage states of the lower physical page, the middle physical page and the upper physical page of the memory cells of the word lines and accordingly obtain the gray codes of the memory cells. For instance, it is assumed that the processor 211 (or the read assisting circuit unit 215) uses the preset read voltage set $V(i)$ to read the word lines to obtain the gray codes of the memory cells of the word lines. The processor 211 (or the read assisting circuit unit 215) first identifies whether the storage states of all the lower physical pages of all the memory cells are the storage state SL1 or the storage state SL2 by using the preset read voltage $V(i)_4$; next, the processor 211 (or the read assisting circuit unit 215) then identifies whether the storage states of all the middle physical pages of all the memory cells are the storage state SM1, the storage state SM2 or the storage state SM3 by using the preset read voltages $V(i)_2$ and $V(i)_6$; next, the processor 211 (or the read assisting circuit unit 215) then identifies whether the storage states of all the upper physical pages of all the memory cells are the storage state SU1, the storage state SU2, the storage state SU3, the storage state SU4 or the storage state SU5 by using the preset read voltages $V(i)_1$, $V(i)_3$, $V(i)_5$ and $V(i)_7$. Accordingly, the processor 211 (or the read assisting circuit unit 215) can identify the storage states of the lower physical pages, the middle physical pages and the upper physical pages of all the memory cells, and thereby identify the gray codes stored by all the memory cells.

In addition, the rewritable non-volatile memory module 220 with the characteristics of having the physical pages and the corresponding number of the preset read voltages may also be regarded as the rewritable non-volatile memory module 220 (the TLC NAND flash memory module) having a first read voltage mode (1/2/4). The so-called "1/2/4" corresponds to a total number of the preset read voltages respectively included by "the lower physical page/the middle physical page/the upper physical page".

In order to facilitate the description of the technical solution provided by the invention, most of the following embodiments are described with the rewritable non-volatile memory module 220 (the TLC NAND flash memory module) having the first read voltage mode (1/2/4) as an example. Nevertheless, the data reading method and the storage controller provided by the invention is also applicable to the rewritable non-volatile memory module 220 having other read voltage modes.

Figure 3B:
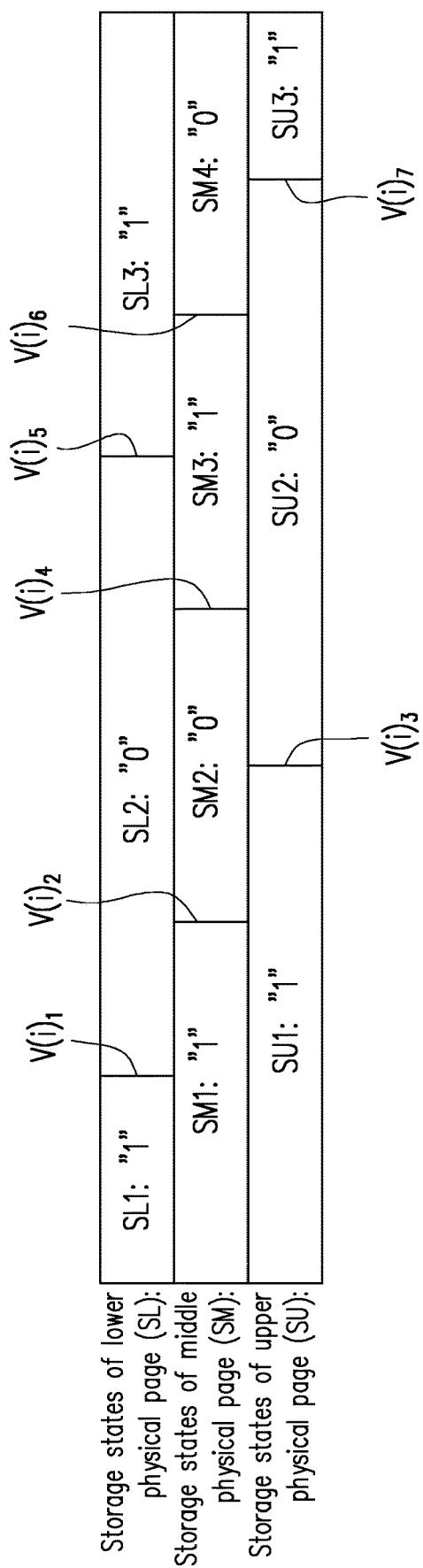
FIG. 3B is a schematic diagram illustrating a second read voltage mode (2/3/2) according to an embodiment of the invention.

FIG. 3B is a schematic diagram illustrating a second read voltage mode (2/3/2) according to an embodiment of the invention. With reference to FIG. 3B, for the rewritable non-volatile memory module 220 (the TLC NAND flash memory module) in a second read voltage mode (2/3/2), the read voltages $V(i)_1$ and $V(i)_5$ are configured to divide storage states SL1 ("1"), SL2 ("0") and SL3 ("1") of the lower physical page; the read voltages $V(i)_2$, $V(i)_4$ and $V(i)_6$ are configured to divide storage states SM1 ("1"), SM2 ("0"), SM3 ("1") and SM4 ("0") of the middle physical page; the read voltages $V(i)_3$ and $V(i)_7$ are configured to divide the storage states SU1 ("1"), SU2 ("0") and SU3 ("1") of the upper physical page.

In this embodiment, the threshold voltage distributions of the physical pages of the memory cells of the word line may have an offset as compared to a preset threshold voltage distribution. Due to the offset of the threshold voltage distribution, the preset read voltages originally preset corresponding to the preset threshold voltages of the physical pages are no longer suitable for dividing the storage states of the corresponding physical pages. That is to say, in this case, the read bit values (a.k.a. a hard bit values) stored by a plurality of memory cells of the originally read and identified physical page may be distorted. At this time, it is required to perform the soft information operation to obtain the soft information corresponding to the memory cells to assist the processor 211 or the error checking and correcting circuit 214 to further identify the read bit values stored by the memory cells or corresponding reliabilities (the reliabilities corresponding to the memory cells may be respectively represented by the log likelihood ratios of the corresponding memory cells).

Figure 1B:
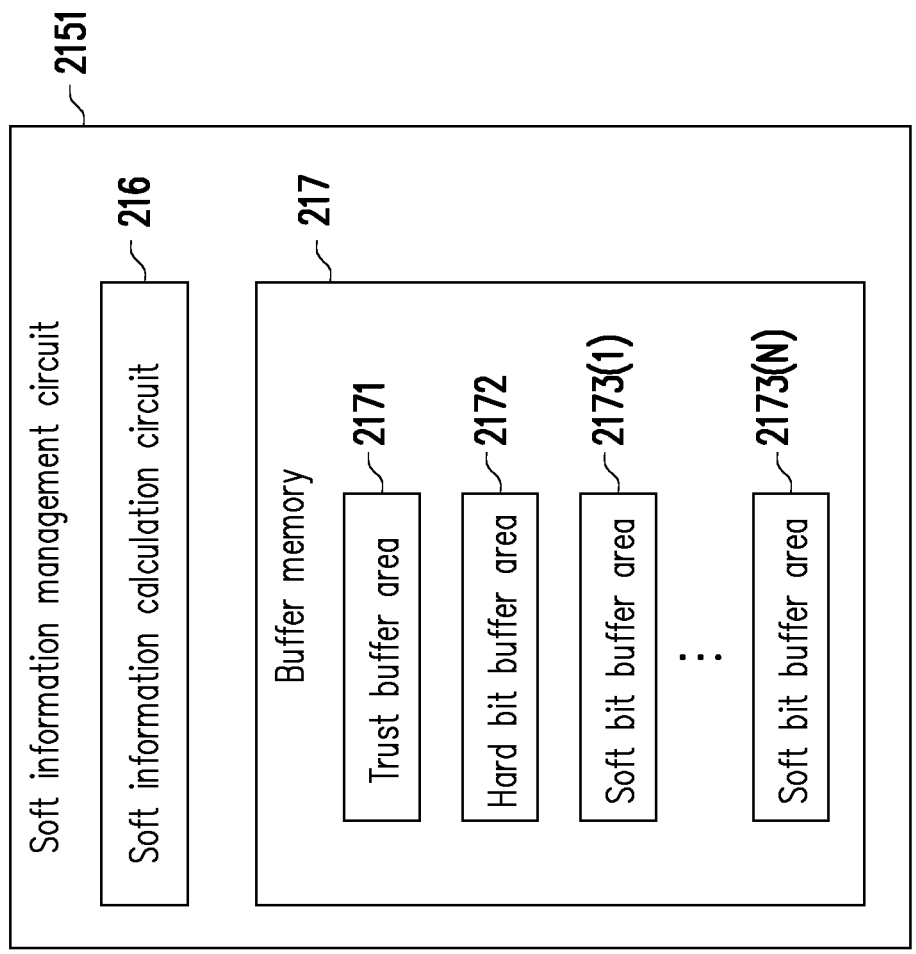
FIG. 1B is a block diagram illustrating a soft information management circuit according to an embodiment of the invention.

FIG. 1B is a block diagram illustrating a soft information management circuit according to an embodiment of the invention. In this embodiment, the soft information management circuit 2151 includes a soft information calculation circuit 216 and a buffer memory 217. Here, the buffer memory 217 includes a plurality of buffer areas, such as a trust buffer area 2171, a hard bit buffer area 2172 and soft bit buffer areas 2173(1) to 2173(N). N is a positive integer greater than or equal to 1. The buffer memory 217 is, for example, a static random access memory, and is configured to temporarily store data. The soft information calculation circuit 216 is configured to calculate the soft information according to the data temporarily stored in the buffer areas. Details regarding the data reading method (a.k.a. a read assisting method) and functions of the read assisting circuit unit 215 provided by the invention are described below with reference to FIG. 2. It should be noted that, operations of various components of the read assisting circuit unit 215 may be regarded as overall operation of the read assisting circuit unit 215.

Figure 2:
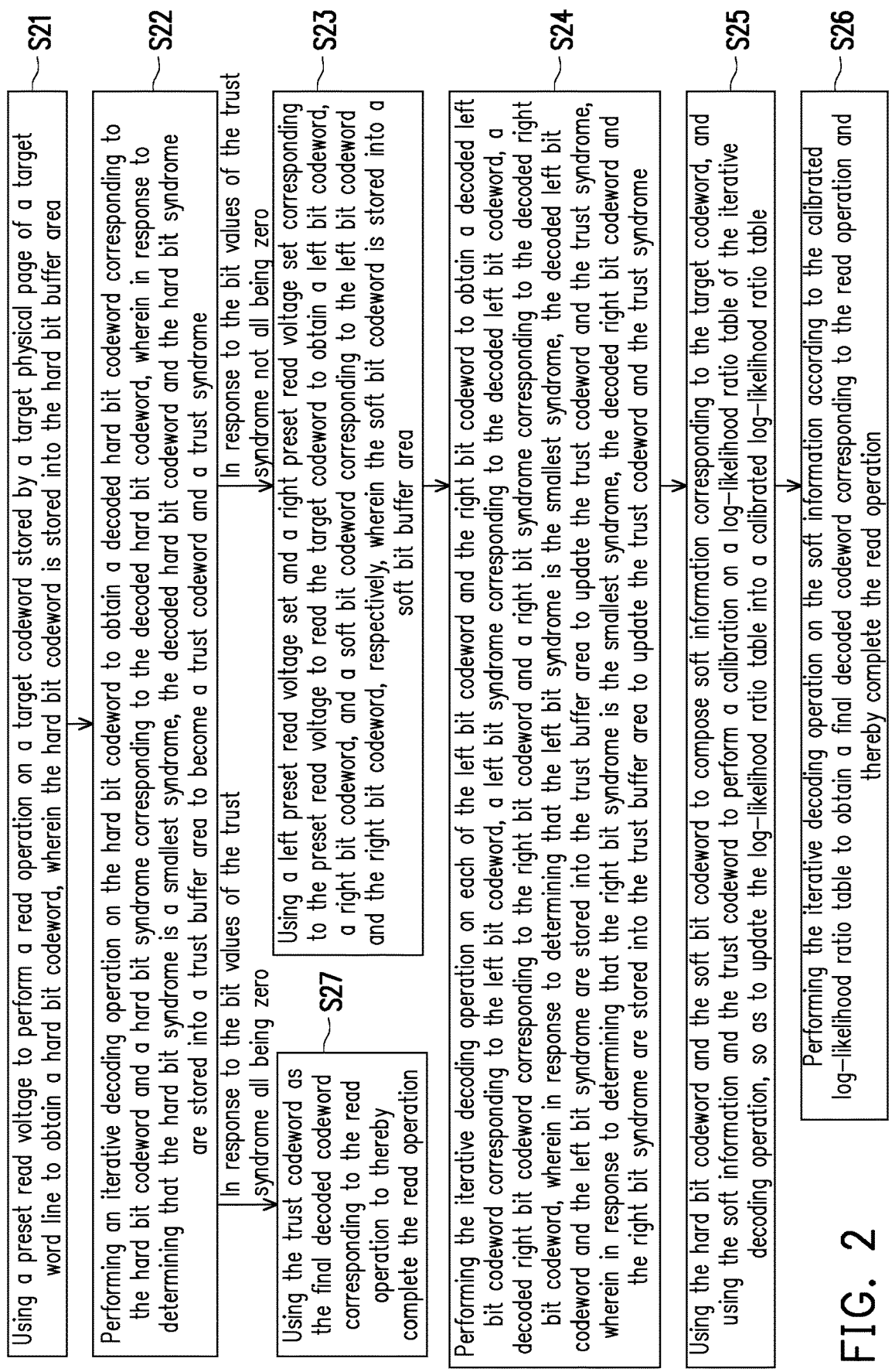
FIG. 2 is a flowchart illustrating a data reading method according to an embodiment of the invention.

FIG. 2 is a flowchart illustrating a data reading method according to an embodiment of the invention. With reference to FIG. 2, in step S21, the read assisting circuit unit 215 (or the soft information management circuit 2151) uses a preset read voltage to perform a read operation on a target codeword stored by a target physical page of a target word line to obtain a hard bit codeword (a.k.a. the original codeword), wherein the hard bit codeword is stored into the hard bit buffer area 2172. Specifically, a plurality of read bit values read from the plurality of target memory cells of the target physical page by using the preset read voltage can compose the hard bit codeword (a.k.a. the original codeword). In addition, the selecting method for the target word line and the target physical page has been described above, and will not be repeated hereinafter. It should be noted that, the invention is not limited by the selecting method described above. In other words, if the processor 211 intends to perform the read assisting operation in page-level on a specific physical page, that specific physical page may be regarded as the target physical page, and the word line to which the specific physical page belongs may be regarded as the target word line.

In step S22, the error checking and correcting circuit 214 performs an iterative decoding operation on the hard bit codeword to obtain a decoded hard bit codeword corresponding to the hard bit codeword and a hard bit syndrome corresponding to the decoded hard bit codeword, wherein in response to determining that the hard bit syndrome is a smallest syndrome, the decoded hard bit codeword and the hard bit syndrome are stored into a trust buffer area to become a trust codeword and a trust syndrome. Specifically, the iterative decoding operation (a.k.a. an LDPC decoding operation) is performed on the original codeword (i.e., the hard bit codeword) by the error checking and correcting circuit 214. As described above, after completing one iterative decoding operation, the error checking and correcting circuit 214 obtains the decoded codeword corresponding to the original codeword and the syndrome (a.k.a. the hard bit syndrome) corresponding to the decoded codeword (a.k.a. the decoded hard bit codeword). In addition, in the case where the trust syndrome and the corresponding trust codeword are stored in the trust buffer area 2171, the error checking and correcting circuit 214 further identifies the number of a first bit value (i.e., "1") among a plurality of bit values of the trust syndrome stored in the trust buffer area 2171, and determines that the syndrome having fewer first bit values among the hard bit syndrome and the trust syndrome is the smallest syndrome. Here, in response to the hard bit syndrome being determined as the smallest syndrome, the error checking and correcting circuit 214 can store the hard bit syndrome and the corresponding decoded hard bit codeword into the trust buffer area 2171 to replace the existing trust codeword and the existing trust syndrome and become the new trust codeword and the new trust syndrome in the trust buffer area 2171.

On the other hand, in the case where the trust syndrome and the corresponding trust codeword are not stored in the trust buffer area 2171, the error checking and correcting circuit 214 (or the soft information management circuit 2151) can directly treat the decoded hard bit codeword as the trust codeword, treat the hard bit syndrome as the trust syndrome, and store the hard bit syndrome and the corresponding decoded hard bit codeword into the trust buffer area 2171.

In this embodiment, as similar to the method for determining whether the iterative decoding operation is successful or failed, the error checking and correcting circuit 214 determines whether the bit values in the trust syndrome are all zero. In response to determining that the bit values of the trust syndrome are not all zero, the process proceeds to step S23; in response to determining that the bit values of the trust syndrome are all zero, the process proceeds to step S27. In step S27, the read assisting circuit unit 215 (or the error checking and correcting circuit 214) uses the trust codeword as the final decoded codeword corresponding to the read operation to thereby complete the read operation. Specifically, if the bit values of the trust syndrome are all zero, the read assisting circuit unit 215 (or the error checking and correcting circuit 214) determines that the trust codeword is the valid codeword indicating that the iterative decoding operation is successful, and correspondingly outputs the valid codeword (i.e., the final decoded codeword) to thereby complete the read operation.

In step S23, the read assisting circuit unit 215 uses a left preset read voltage set and a right preset read voltage set corresponding to the preset read voltage to read the target codeword to obtain a left bit codeword, a right bit codeword, and a soft bit codeword corresponding to the left bit codeword and the right bit codeword, respectively, wherein the soft bit codeword is stored into a soft bit buffer area. The following embodiment is described with reference to FIG. 3C. However, it should be noted that, although the following embodiment is described with the lower physical page used as an example of the target physical page, the invention is not limited thereto. Persons skilled in the art can apply the data reading method of the invention to the target physical pages of other types, such as the middle physical page or the upper physical page.

Figure 3C:
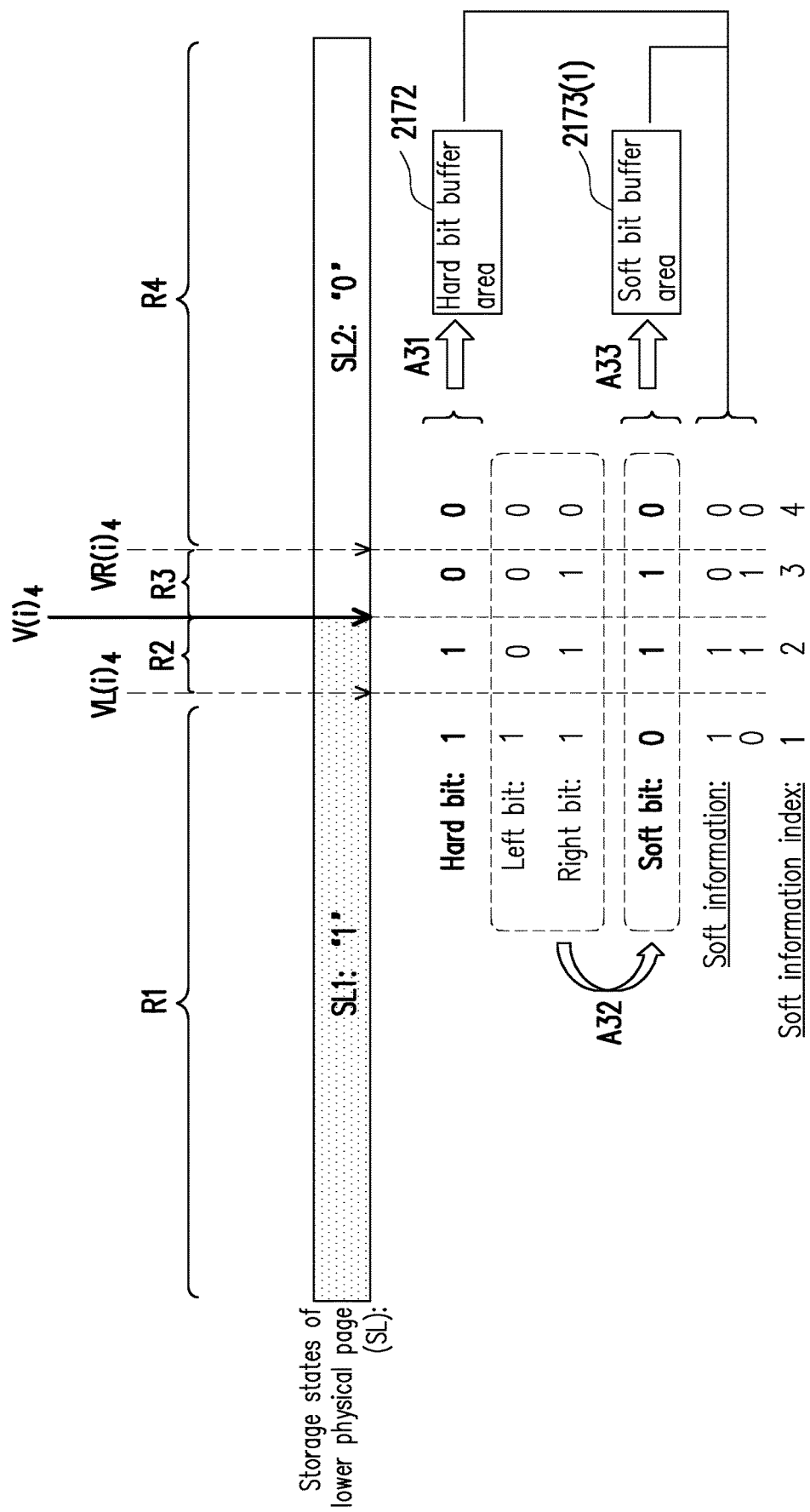
FIG. 3C is a schematic diagram for generating soft information corresponding to storage states of a lower physical page according to an embodiment of the invention.

FIG. 3C is a schematic diagram for generating soft information corresponding to storage states of a lower physical page according to an embodiment of the invention. With reference to FIG. 3C, it is assumed that a threshold voltage distribution may be divided into areas R1 to R4 according to soft information index values "1" to "4". Further, in this embodiment, for the storage states and the hard bit values of a plurality of memory cells of the lower physical page, the read assisting circuit unit 215 can use a preset read voltage $V(i)_4$, a left preset read voltage $VL(i)_4$ and a right preset read voltage $VR(i)_4$ corresponding to the preset read voltage $V(i)_4$ to read the lower physical page, so as to obtain the hard bit codeword corresponding the memory cells of the lower physical page, respectively. For example, as shown by FIG. 3C, the hard bit values of a plurality of soft information areas corresponding to the soft information index values are "1 1 0 0" (the bit values of the target memory cells with the threshold voltage on the left of the preset read voltage $V(i)_4$ are identified as 1; the bit values of the target memory cells with the threshold voltage on the right of the preset read voltage $V(i)_4$ are identified as 0); left bit values corresponding to the left preset read voltage $VL(i)_4$ are "1 0 0 0" (the bit value of the memory cell with the threshold voltage on the left of the left preset read voltage $VL(i)_4$ is identified as 1; the bit values of the memory cells with the threshold voltage on the right of the left preset read voltage $VL(i)_4$ are identified as 0); and right bit values corresponding to the right preset read voltage $VR(i)_4$ are "1 1 1 0" (the bit values of the memory cells with the threshold voltage on the left of the right preset read voltage $VR(i)_4$ are identified as 1; the bit value of the memory cell with the threshold voltage on the right of the right preset read voltage $VR(i)_4$ is identified as 0). The soft information areas include the area R1 with the threshold voltage distribution corresponding to the soft information index "1" on the left of the left preset read voltage $VL(i)_4$; the area R2 with the threshold voltage distribution corresponding to the soft information index "2" between the preset read voltage $V(i)_4$ and the left preset read voltage $VL(i)_4$; the area R3 with the threshold voltage distribution corresponding to the soft information index "3" between the preset read voltage $V(i)_4$ and the right preset read voltage $VR(i)_4$; the area R4 with the threshold voltage distribution corresponding to the soft information index "4" on the right of the right preset read voltage $VR(i)_4$.

In this embodiment, the hard bit values of the target memory cells can compose the hard bit codeword; the left bit values of the target memory cells can compose the left bit codeword; and the right bit values of the target memory cells can compose the right bit codeword.

In this embodiment, according to the preset read voltage $V(i)_4$, the read assisting circuit unit 215 can generate the left preset read voltage $VL(i)_4$ and the right preset read voltage $VR(i)_4$ corresponding to the preset read voltage $V(i)_4$. For instance, the left preset read voltage $VL(i)_4$ corresponding to the preset read voltage $V(i)_4$ is, for example, a voltage less than the preset read voltage $V(i)_4$ by a first preset voltage offset; the right preset read voltage $VR(i)_4$ corresponding to the preset read voltage $V(i)_4$ is, for example, a voltage greater than the preset read voltage $V(i)_4$ by a second preset voltage offset. The first preset voltage offset can be equal to the second preset voltage offset.

In this embodiment, as shown by an arrow A31, the read assisting circuit unit 215 (or the soft information management circuit 2151) can store the hard bit codeword into the hard bit buffer area 2172.

As show by an arrow A32, the read assisting circuit unit 215 (or the soft information management circuit 2151) can perform an exclusive OR operation (XOR operation) or an exclusive NOR operation (XNOR operation) on the left bit values and the right bit values of the target memory cells to obtain operation results, and use the operation results as soft bit values corresponding to the target memory cells. For example, the results of the XOR operation performed on the left bit values "1 0 0 0" (representing the left bit value of each of the target memory cells of the areas R1 to R4 corresponding to the soft information indexes "1", "2", "3" and "4") and the right bit values "1 1 1 0" (representing the right bit value of each of the target memory cells of the areas R1 to R4 corresponding to the soft information indexes "1", "2", "3" and "4") are "0 1 1 0", which are the corresponding soft bit values "0 1 1 0" (representing the soft bit value of each of the target memory cells of the areas R1 to R4 corresponding to the soft information indexes "1", "2", "3" and "4"). The soft bit values of the target memory cells can compose the soft bit codeword.

Next, as shown by an arrow A33, the read assisting circuit unit 215 (or the soft information management circuit 2151) can store the soft bit codeword into the soft bit buffer area 2173(1).

Referring to FIG. 2 again, in step S24, the error checking and correcting circuit 214 performs the iterative decoding operation on each of the left bit codeword and the right bit codeword to obtain a decoded left bit codeword corresponding to the left bit codeword, a left bit syndrome corresponding to the decoded left bit codeword, a decoded right bit codeword corresponding to the right bit codeword and a right bit syndrome corresponding to the decoded right bit codeword. This step is similar to step S22, and thus details regarding the same are not repeated hereinafter.

Nonetheless, it should be noted that, normally, in the conventional method, the iterative decoding operation is not additionally performed on each of the left bit codeword and the right bit codeword to obtain the corresponding decoded left bit codeword, the left bit syndrome, the right bit codeword and the right bit syndrome. Instead, in the conventional method, the left bit codeword and the right bit codeword are only used to compose the soft bit codeword.

In this embodiment, by additionally performing the iterative decoding operation on each of the left bit codeword and the right bit codeword, the error checking and correcting circuit 214 can further determine whether the left bit syndrome or the right bit syndrome is the smallest syndrome. Similarly, the error checking and correcting circuit 214 can compare the left bit syndrome or the right bit syndrome with the trust syndrome stored in the trust buffer area 2171, so as to find the smallest syndrome having the fewest first bit values from the left bit syndrome, the right bit syndrome and the trust syndrome.

In response to determining that the left bit codeword is the smallest syndrome, the soft information management circuit 2151 stores the decoded left bit codeword and the left bit syndrome into the trust buffer area 2171, so as to update the trust codeword and the trust syndrome; In response to determining that the right bit codeword is the smallest syndrome, the soft information management circuit 2151 stores the decoded right bit codeword and the right bit syndrome into the trust buffer area 2171, so as to update the trust codeword and the trust syndrome.

Next, in step S25, the read assisting circuit unit 2151 uses the hard bit codeword and the soft bit codeword to compose soft information corresponding to the target codeword, and the LLR table calibration circuit 2152 uses the soft information and the trust codeword to perform a calibration on a log-likelihood ratio table of the iterative decoding operation, so as to update the log-likelihood ratio table into a calibrated log-likelihood ratio table.

Referring to FIG. 3C again, the soft information management circuit 2151 can combine the obtained soft bit values "0 1 1 0" with the hard bit values "1 1 0 0" (representing the hard bit value of each of the target memory cells of the areas R1 to R4 corresponding to the soft information indexes "1", "2", "3" and "4") to obtain the soft information "10 11 01 00" (representing the soft information of each of the target memory cells of the areas R1 to R4 corresponding to the soft information indexes "1", "2", "3" and "4"). In each bit pair (e.g., "10") of the soft information "10 11 01 00", the first bit value is the hard bit value and the second bit value is the soft bit value.

In this way, according to the bit pair "10" in the soft information "10 11 01 00", the processor 211 or the error checking and correcting circuit 214 can know that the hard bit value "1" corresponding to the bit pair "10" is farther from an intersection of the threshold voltage distributions of the storage states SL1 and SL2, i.e., this hard bit value "1" has higher reliability; according to the bit pair "11" in the soft information "10 11 01 00", the processor 211 or the error checking and correcting circuit 214 can know that the hard bit value "1" corresponding to the bit pair "11" is closer to the intersection of the threshold voltage distributions of the storage states SL1 and SL2, i.e., this hard bit value "1" has lower reliability; according to the bit pair "01" in the soft information "10 11 01 00", the processor 211 or the error checking and correcting circuit 214 can know that the hard bit value "0" corresponding to the bit pair "01" is closer to the intersection of the threshold voltage distributions of the storage states SL1 and SL2, i.e., this hard bit value "0" has lower reliability; according to the bit pair "00" in the soft information "10 11 01 00", the processor 211 or the error checking and correcting circuit 214 can know that the hard bit value "0" corresponding to the bit pair "00" is farther from the intersection of the threshold voltage distributions of the storage states SL1 and SL2, i.e., this hard bit value "0" has higher reliability.

In this embodiment, the LLR table calibration circuit 2152 can specifically express the reliabilities and the bit values corresponding to the different soft information according to the log-likelihood ratios respectively corresponding to the different soft information indexes in the log-likelihood ratio table corresponding to the lower physical page. Specifically, the LLR table calibration circuit 2152 can use the formula below to calculate the log-likelihood ratios corresponding to the different soft information indexes, so as to calibrate the log-likelihood ratios in the originally preset log-likelihood ratio table.

$$LLR(SI_i) = \ln\left(\frac{Pr(X = 0 | SI_i)}{Pr(X = 1 | SI_i)}\right) =$$

$$\ln\left(\frac{CNT(X = 0 \cap SI_i)/CNT(SI_i)}{CNT(X = 1 \cap SI_i)/CNT(SI_i)}\right) = \ln\left(\frac{CNT(X = 0 \cap SI_i)}{CNT(X = 1 \cap SI_i)}\right)$$

"$SI_i$" indicates the soft information index; "$Pr(X=0|SI_i)$" indicates the probability that the bit values of the memory cells (i.e., the target memory cells) of the area R1 corresponding to the soft information index "$SI_i$" is "0"; "$Pr(X=1|SI_i)$" indicates the probability that the bit values of the target memory cells of the area R1 corresponding to the soft information index "$SI_i$" is "1"; "$CNT(X=0 \cap SI_i)$" indicates a total number of the memory cells with the bit value being "0" in the trust codeword of the area R1 belonging to the soft information index "$SI_i$"; "$CNT(X=1 \cap SI_i)$" indicates a total number of the memory cells with the bit value being "1" in the trust codeword of the area R1 belonging to the soft information index "$SI_i$"; "$CNT(SI_i)$" indicates a total number of the memory cells in the area R1 belonging to the soft information index "$SI_i$".

FIG. 6 is a schematic diagram illustrating how a plurality of log-likelihood ratios of a calibrated log-likelihood ratio table are calculated based on a trust codeword according to an embodiment of the invention. With reference to FIG. 6, for instance, as shown by a table 600, the LLR table calibration circuit 2152 can count the total number of the target memory cells with the bit value being "0" and the total number of the target memory cells with the bit value being "1" in each of the areas R1 to R4 corresponding to the different soft information index values according to the soft information included by the target memory cells with the bit value being "0" in the trust codeword and the soft information included by the target memory cells with the bit value being "1" in the trust codeword.

For example, the LLR table calibration circuit 2152 selects one bit value being "0" (which corresponds to one memory cell) in the trust codeword, and identifies that the soft information index value corresponding to that memory cell is $SI_1$. Next, the LLR table calibration circuit 2152 accumulates the total number of the bit values being "0" corresponding to the soft information index value $SI_1$ (by adding 1 to the total number of the bit values being "0" corresponding to the soft information index $SI_1$). By analogy, the LLR table calibration circuit 2152 selects the next bit value in the trust codeword, and accumulates the corresponding total umber according to the selected bit value being "0" or "1" and the corresponding soft information index value. Statistical results are, for example, as shown by the table 600.

After obtaining the statistical results, the LLR table calibration circuit 2152 calculates the log-likelihood ratios corresponding to the different soft information indexes (i.e., perform the calibration) according to the above formula, so as to obtain the calibrated log-likelihood ratio table. For example, for $SI_1$, $LLR(SI_1)=\ln(5/17497)=-8.160346804-2105194090619179701932$. The LLR table calibration circuit 2152 then rounds "$-8.160346804 2105194090619 179701932$" to an integer "$-8$". The calibrated log-likelihood ratio table may be used to update the original log-likelihood ratio table. It should be noted, in the above example, the LLR table calibration circuit 2152 simplifies the calculated log-likelihood ratio by "rounding to", but the invention is not limited thereto. For example, in other embodiments, the LLR table calibration circuit 2152 can simplifies the calculated log-likelihood ratio by ways of "rounding up to an integer" or "rounding down to an integer". Alternatively, the calculated log-likelihood ratio may also be simplified into a particular type of value using other suitable methods.

In this embodiment, the log-likelihood ratio corresponding to one soft information index being a negative number means that the bit value stored by the corresponding memory cell should be "1", and the log-likelihood ratio being smaller means that the probability that the bit value stored by the corresponding memory cell being "1" is higher; the log-likelihood ratio corresponding to one soft information index being a positive number means that the bit value stored by the corresponding memory cell should be "0", and the log-likelihood ratio being greater means that the probability that the bit value stored by the corresponding memory cell being "0" is higher.

Next, in step S26, the error checking and correcting circuit 214 performs the iterative decoding operation on the soft information according to the calibrated log-likelihood ratio table to obtain a final decoded codeword corresponding to the read operation and thereby complete the read operation. Specifically, after obtaining the more accurate calibrated log-likelihood ratio table corresponding to the target physical page, the error checking and correcting circuit 214 can perform one or more iterative decoding operations on the soft information according to the calibrated log-likelihood ratio table to obtain the valid codeword (a.k.a. the final decoded codeword) from the successful decoding. As described above, the bit values of the syndrome corresponding to the valid codeword are all zero.

After obtaining the final decoded codeword, the error checking and correcting circuit 214 determines that the read operation corresponding to the target codeword stored by the target physical page is completed. A plurality of bit values of the final decoded codeword are configured to represent a plurality of target bit values read from the stored target codeword.

In an embodiment, after obtaining the final decoded codeword (or the valid codeword), the LLR table calibration circuit 2152 can use the soft information corresponding to the target codeword and the final decoded codeword to perform the calibration again on the log-likelihood ratio table of the iterative decoding operation, so as to update the calibrated log-likelihood ratio table of the iterative decoding operation again. As similar to the above, the LLR table calibration circuit 2152 can select the bit value corresponding to one memory cell from the final decoded codeword, and further accumulate the total number of the bit values of the corresponding soft information index value according to the soft information corresponding to the memory cell/the bit value. After all the bit values of the final decoded codeword are completely counted for the corresponding soft information, the log-likelihood ratios corresponding to the different soft information index values are then calculated so the calibrated log-likelihood ratio table can then be obtained.

Moreover, in an embodiment, after updating the log-likelihood ratio table corresponding to the target physical page into the calibrated log-likelihood ratio table in the iterative decoding operation, the error checking and correcting circuit 214 performs the step of performing the iterative decoding operation on the soft information to obtain the decoded hard bit codeword corresponding to the hard bit codeword and the hard bit syndrome corresponding to the decoded hard bit codeword again according to the calibrated log-likelihood ratio table. Specifically, since the log-likelihood ratio table of the iterative decoding operation has been calibrated, the more accurate decoded codeword may be obtained through the calibrated log-likelihood ratio table. Accordingly, the error checking and correcting circuit 214 can perform the iterative decoding operation on the soft information again to expect the more accurate valid codeword to be obtained.

It is worth noting that, in the above embodiments, although the number of the left preset read voltages corresponding to the preset read voltage is 1 and the number of the right preset read voltages corresponding to the preset read voltage is 1, the invention is not limited thereto. For example, in another embodiment, the number of the left preset read voltages corresponding to the preset read voltage may be N and the number of the right preset read voltages corresponding to the preset read voltage may be N. Corresponding to the N left preset read voltages and the N right preset read voltages, the buffer memory 217 can have N soft bit buffer areas 2173(1) to 2173(N). Details regarding this step are described below with reference to FIG. 4.

Figure 4A:
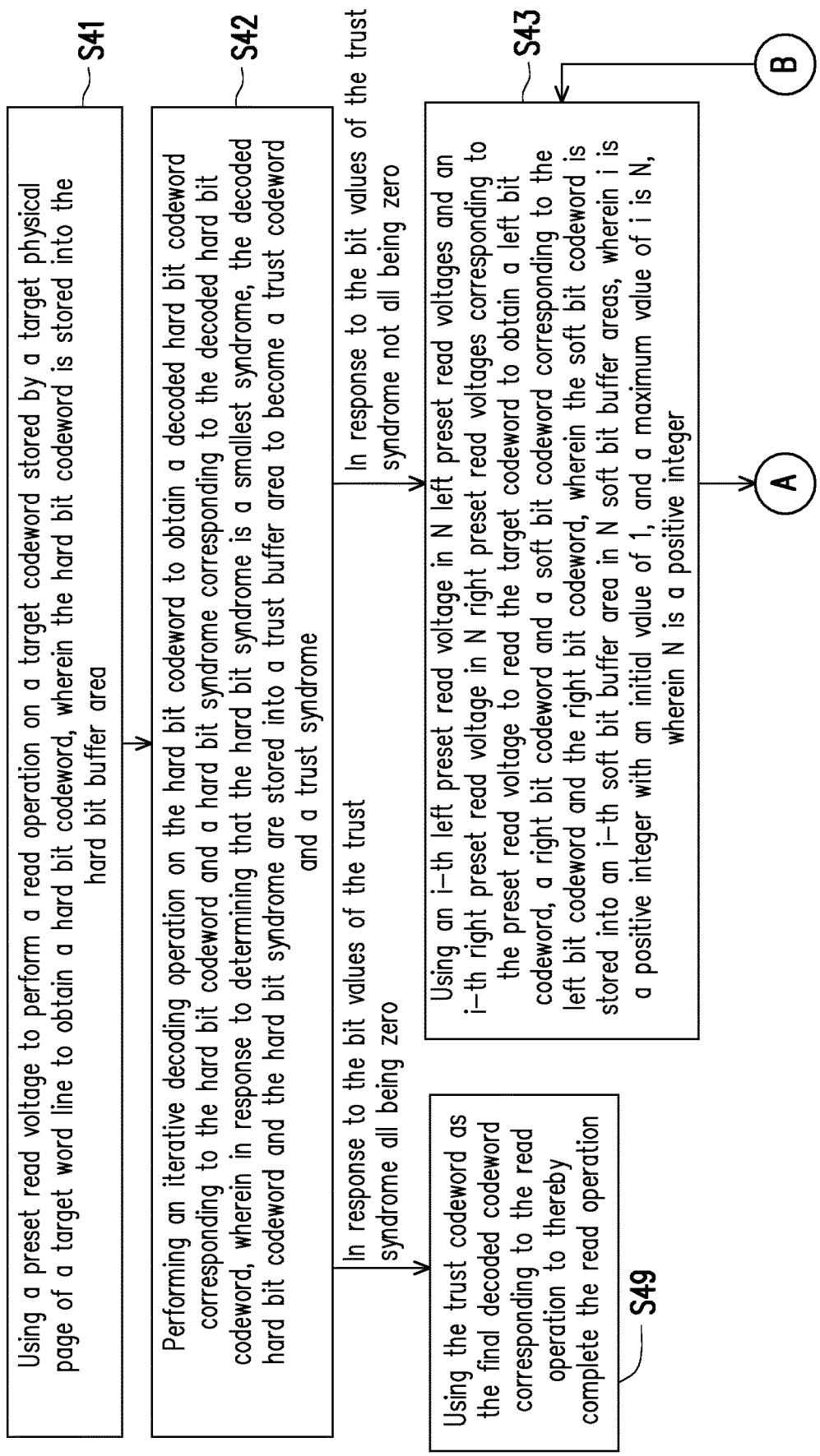
FIGS. 4A-4B are flowcharts illustrating a data reading method according to another embodiment of the invention.
Figure 4B:
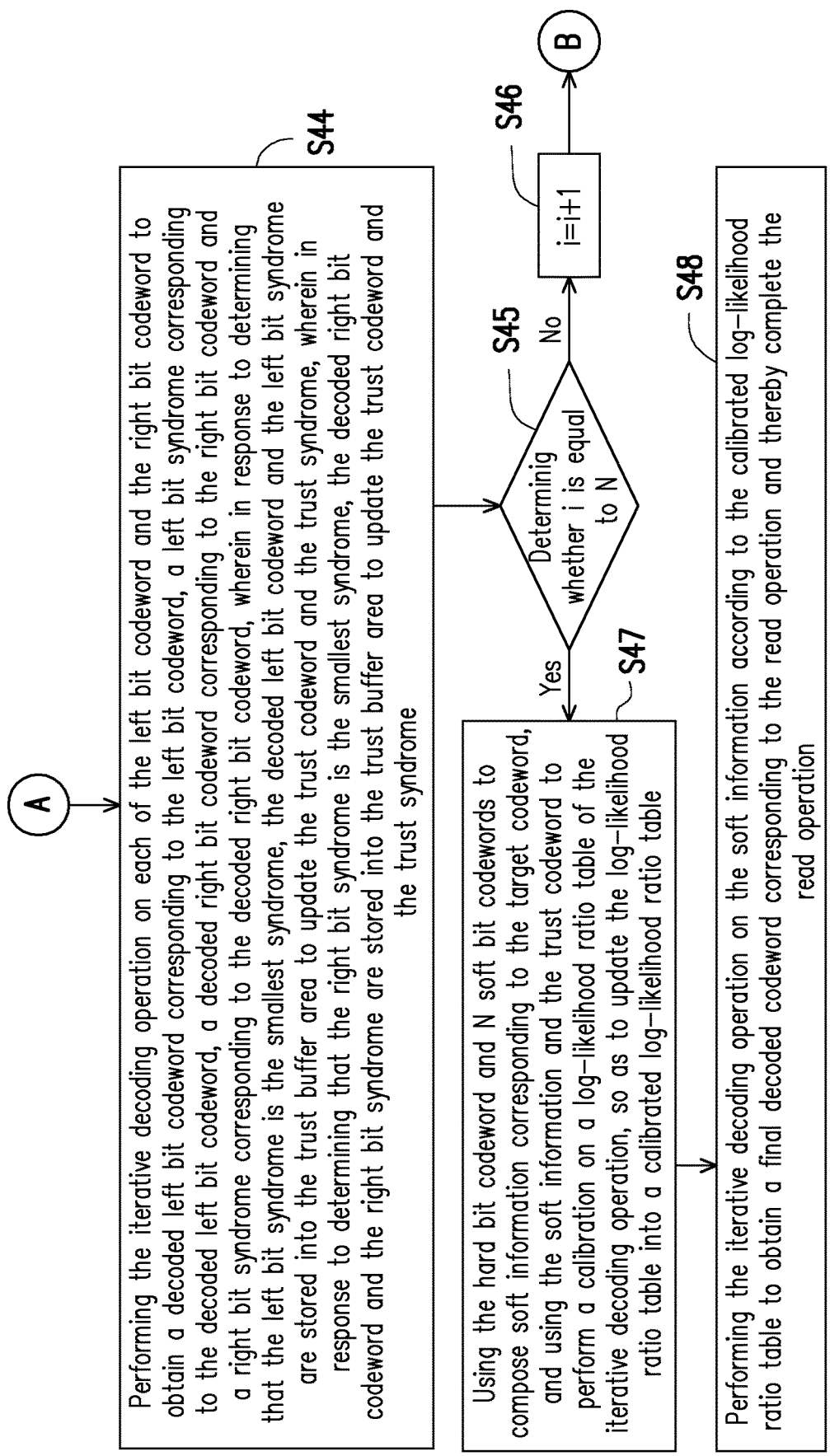

FIGS. 4A-4B are flowcharts illustrating a data reading method according to another embodiment of the invention. With reference to FIGS. 4A-4B, steps S41, S42, S44, S47, S48 and S49 in the data reading method of this embodiment are identical to steps S21, S22, S23, S25, S26 and S27 in FIG. 2, respectively, and thus details regarding the same are not repeated hereinafter. Only the differences between them are explained as follow.

In step S43, the read assisting circuit unit 215 (or the soft information management circuit 2151) uses an i-th left preset read voltage in N left preset read voltages and an i-th right preset read voltage in N right preset read voltages corresponding to the preset read voltage to read the target codeword to obtain a left bit codeword, a right bit codeword and a soft bit codeword corresponding to the left bit codeword and the right bit codeword. Here, the soft bit codeword is stored into an i-th soft bit buffer area in N soft bit buffer areas. Here, i is a positive integer with an initial value of 1, and a maximum value of i is N. Herein, N is a positive integer. i is configured to indicate an arranged order of the left preset read voltage/the right preset read voltage currently selected for generating the soft bit. Details regarding this step are described below with reference to FIG. 5.

Figure 5:
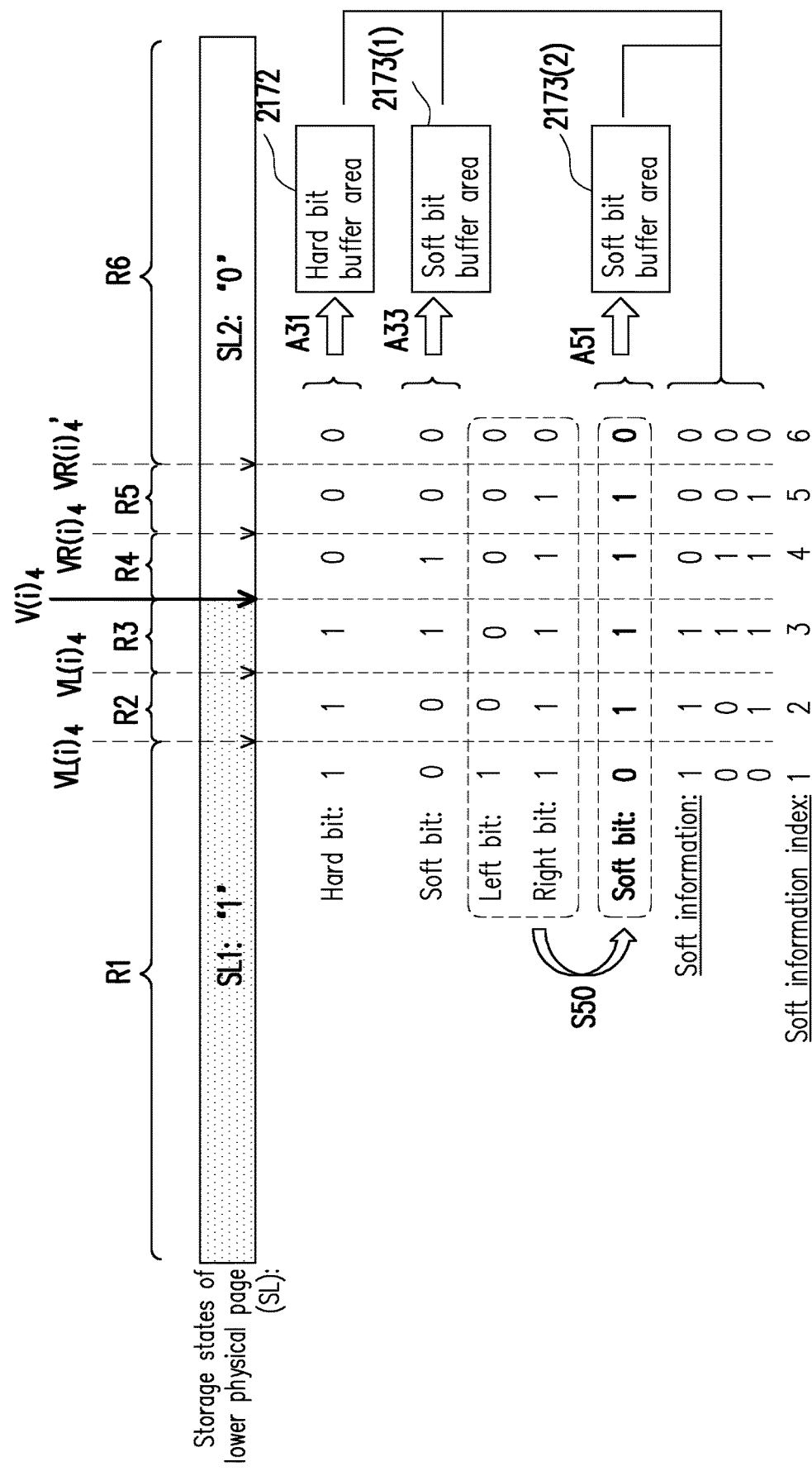
FIG. 5 is a schematic diagram for generating soft information corresponding to storage states of a lower physical page according to another embodiment of the invention.

FIG. 5 is a schematic diagram for generating soft information corresponding to storage states of a lower physical page according to another embodiment of the invention. With reference to FIG. 5, it is assumed that a threshold voltage distribution may be divided into areas R1 to R6 according to soft information index values "1" to "6", where N is 2. There are two left preset read voltages corresponding to the preset read voltage $V(i)_4$, including a left preset read voltage $VL(i)_4$ and a left preset read voltage $VL(i)_4'$; there are two right preset read voltages corresponding to the preset read voltage $V(i)_4$, including a right preset read voltage $VR(i)_4$ and a right preset read voltage $VR(i)_4'$. Here, a voltage difference between the left preset read voltage $VL(i)_4$ and the left preset read voltage $VL(i)_4'$ is a first preset voltage offset; a voltage difference between the right preset read voltage $VR(i)_4'$ and the right preset read voltage $VR(i)_4$ is a second preset voltage offset.

As similar to FIG. 3C, the soft information management circuit 2151 can use the preset read voltage $V(i)_4$, the left preset read voltage $VL(i)_4$ (the first left preset read voltage in the two left preset read voltages) and the right preset read voltage $VR(i)_4'$ (the first right preset read voltage in the two right preset read voltages) to obtain the hard bit codeword "1 1 1 0 0 0" (the hard bit values respectively corresponding to the memory cells of the areas R1 to R6) and the soft bit codeword "0 0 1 1 0 0" (the soft bit values respectively corresponding to the memory cells of the areas R1 to R6), store the hard bit codeword "1 1 1 0 0 0" into the hard bit buffer area 2172 (the arrow A31), and store the soft bit codeword "0 0 1 1 0 0" into the hard bit buffer area 2173(1) (the arrow A32). Next, the error checking and correcting circuit 214 executes step S44. It should be noted that, at this time point, N is equal to 2 and i is equal to 1.

Next, in step S45, the soft information management circuit 2151 determines whether i is equal to N. In response to determining that i is equal to N, the soft information management circuit 2151 executes step S47; In response to determining that i is not equal to N, the soft information management circuit 2151 executes step S46. In step S46, the soft information management circuit 2151 adds 1 to i, and continues to execute step S43 (through node B).

In this example, since i is not equal to N, i is added by 1 to become 2. That is to say, the soft information management circuit 2151 selects the second left preset read voltage in the two left preset read voltages and the second right preset read voltage in the two preset read voltages to execute step S43. With reference to FIG. 5, the soft information management circuit 2151 further uses the left preset read voltage $VL(i)_4'$ to obtain the left bit codeword "1 0 0 0 0 0" (the left bit values respectively corresponding to the memory cells of the areas R1 to R6), and uses the right preset read voltage $VR(i)_4'$ to obtain the right bit codeword "1 1 1 1 1 0" (the right bit values respectively corresponding to the memory cells of the areas R1 to R6). Next, as shown by an arrow A50, the soft information management circuit 2151 can calculate the soft bit codeword "0 1 1 1 1 0" (the soft bit values respectively corresponding to the memory cells of the areas R1 to R6) through the XOR operation according to the left bit codeword "1 0 0 0 0 0" and the right bit codeword "1 1 1 1 1 0", and store the soft bit codeword "0 1 1 1 1 0"

into the other soft bit buffer area 2173(2) (as shown by an arrow A51). The process then proceeds to step S44 and step S45 (through node A).

At this time, in step S45, the soft information management circuit 2151 determines that i is equal to N (since i is equal to 2), and continues to execute step S47. For example, the soft information management circuit 2151 composes the soft information "100 101 111 011 001 000" (the soft information respectively corresponding to the memory cells of the areas R1 to R6) according to the hard bit codeword "1 1 1 0 0 0", the soft bit codeword "0 0 1 1 0 0" and the soft bit codeword "0 1 1 1 1 0" (step S47). For example, the soft information belonging to the memory cells of the area R2 corresponding to the soft information index "2" is "101".

In this embodiment, a total number of the bit values of the soft information of each memory cell is "3" which is equal to N+1, but the invention is not limited thereto. Based on demands, manufacturers can set the total number of the bit values of the soft information of each memory cell and correspondingly set the value of N.

It is worth noting that, in the foregoing embodiments, the read assisting circuit unit 215 is implemented in form of hardware circuit, but the invention is not limited thereto. For example, in an embodiment, the read assisting circuit unit 215 may be implemented in form of software as a read assisting program code module with the functions of the read assisting circuit unit 215. The read assisting program code module may include a soft information management program code module and an LLR table calibration program code module. The soft information management program code module is a program code module with the functions of the soft information management circuit 2151; The LLR table calibration program code module is a program code module with the functions of the LLR table calibration circuit. The processor 211 can access and execute the read assisting management program code module (or the soft information management program code module and the LLR table calibration program code module) to realize the data reading method provided by the invention.

In summary, the data reading method, the storage controller and the storage device provided by the embodiments of the invention can execute the read assisting operation corresponding to the target physical page of the target word line on any programmed target word line without preparing the verified data. In the read assisting operation, the log-likelihood ratio table of the iterative decoding operation may be calibrated by using the soft information corresponding to the codeword stored by the specific physical page (the codeword is neither the preset data or the known verified data) and the trust codeword having the smallest syndrome corresponding to the codeword without preparing the verified data, so as to improve the correct rate of the decoding operation performed on the codeword stored by the specific physical page. As a result, the correct rate and the reliability of the data read form the target word line may be improved to reduce the loading of the decoding operation performed on the read data and thereby improve the overall efficiency of the data reading operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data reading method, adapted to a storage device disposed with a rewritable non-volatile memory module, wherein the rewritable non-volatile memory module has a plurality of word lines, wherein each word line among the word lines is coupled to a plurality of memory cells, wherein each memory cell among the memory cells comprises a plurality of physical pages, each physical page among the physical pages is configured to be programmed as a bit value, and the method comprises:

using a preset read voltage to perform a read operation on a target codeword stored by a target physical page of a target word line to obtain a hard bit codeword, wherein the hard bit codeword is stored into a hard bit buffer area, wherein a plurality of target memory cells of the target physical page are configured to store a plurality of target bit values of the target codeword, respectively;

performing an iterative decoding operation on the hard bit codeword to obtain a decoded hard bit codeword corresponding to the hard bit codeword and a hard bit syndrome corresponding to the decoded hard bit codeword, wherein in response to determining that the hard bit syndrome is a smallest syndrome, the decoded hard bit codeword and the hard bit syndrome are stored into a trust buffer area to become a trust codeword and a trust syndrome;

in response to a plurality of bit values of the trust syndrome not all being zero, performing steps of:

using a left preset read voltage set and a right preset read voltage set corresponding to the preset read voltage to read the target codeword to obtain a left bit codeword, a right bit codeword, and a soft bit codeword corresponding to the left bit codeword and the right bit codeword, respectively, wherein the soft bit codeword is stored into a soft bit buffer area;

performing an iterative decoding operation on each of the left bit codeword and the right bit codeword to obtain a decoded left bit codeword corresponding to the left bit codeword, a left bit syndrome corresponding to the decoded left bit codeword, a decoded right bit codeword corresponding to the right bit codeword and a right bit syndrome corresponding to the decoded right bit codeword, using the hard bit codeword and the soft bit codeword to compose soft information corresponding to the target codeword, and using the soft information and the trust codeword to perform a calibration on a log-likelihood ratio table of the iterative decoding operation, so as to update the log-likelihood ratio table into a calibrated log-likelihood ratio table; and performing the iterative decoding operation on the soft information according to the calibrated log-likelihood ratio table to obtain a final decoded codeword corresponding to the read operation and thereby complete the read operation, wherein a plurality of bit values of the final decoded codeword are configured to represent the plurality of target bit values of the stored target codeword.

2. The data encoding method according to claim 1, further comprising:

in response to determining that the left bit syndrome is the smallest syndrome, storing the decoded left bit codeword and the left bit syndrome into the trust buffer area to update the trust codeword and the trust syndrome, and in response to determining that the right bit syndrome is the smallest syndrome, storing the decoded right bit codeword and the right bit syndrome into the trust buffer area to update the trust codeword and the trust syndrome.

3. The data reading method according to claim 2, wherein in response to the plurality of bit values of the trust syndrome all being zero, the method further comprises:
using the trust codeword as the final decoded codeword corresponding to the read operation to thereby complete the read operation.

4. The data reading method according to claim 1, wherein after obtaining the final decoded codeword, the method further comprises:
using the soft information and the final decoded codeword to perform the calibration again on the log-likelihood ratio table of the iterative decoding operation, so as to update the calibrated log-likelihood ratio table of the iterative decoding operation again.

5. The data reading method according to claim 1, wherein after updating the calibrated log-likelihood ratio table, the method further comprises:
performing the step of performing the iterative decoding operation on the soft information to obtain the decoded hard bit codeword corresponding to the hard bit codeword and the hard bit syndrome corresponding to the decoded hard bit codeword again according to the calibrated log-likelihood ratio table.

6. The data reading method according to claim 1, wherein a voltage value of the left preset read voltage corresponding to the preset read voltage is a voltage value of the preset read voltage minus a first preset voltage offset,
wherein a voltage value of the right preset read voltage corresponding to the preset read voltage is the voltage value of the preset read voltage plus a second preset voltage offset.

7. The data reading method according to claim 6, wherein the first preset voltage offset is equal to the second preset voltage offset.

8. The data reading method according to claim 7, wherein the step of using the left preset read voltage set and the right preset read voltage set corresponding to the preset read voltage to read the target codeword to obtain the left bit codeword, the right bit codeword, and the soft bit codeword corresponding to the left bit codeword and the right bit codeword, respectively, comprises:
using a left preset read voltage of the left preset read voltage set to read the target codeword stored by the target physical page to obtain a left bit value of each of the plurality of target memory cells, wherein the left bit values of the plurality of target memory cells compose the left bit codeword;
using a right preset read voltage of the right preset read voltage set to read the target codeword stored by the target physical page to obtain a right bit value of each of the plurality of target memory cells, wherein the right bit values of the plurality of target memory cells compose the right bit codeword; and
performing an XOR operation or an XNOR operation on the left bit value and the right bit value of each of the plurality of target memory cells, and using a first operation result corresponding to the XOR operation or a second operation result corresponding to the XNOR operation as a soft bit value of each of the plurality of target memory cells, wherein the soft bit values of the plurality of target memory cells compose the soft bit codeword.

9. A storage controller, configured to control a storage device having a rewritable non-volatile memory module, the storage controller comprising:
a connection interface circuit, configured to couple to a host system;
a memory interface control circuit, configured to couple to the rewritable non-volatile memory module, wherein the rewritable non-volatile memory module has a plurality of word lines, wherein each word line among the plurality of word lines is coupled to a plurality of memory cells, wherein each memory cell among the memory cells comprises a plurality of physical pages, and each physical page among the physical pages is configured to be programmed as a bit value;
a read assisting circuit unit;
an error checking and correcting circuit; and
a processor, coupled to the connection interface circuit, the memory interface control circuit, the read assisting circuit unit and the error checking and correcting circuit,
wherein the processor is configured to select a target word line among the plurality of word lines of the rewritable non-volatile memory module, and select a target physical page in the target word line,
wherein the read assisting circuit unit is configured to use a preset read voltage to perform a read operation on the target codeword stored by the target physical page to obtain a hard bit codeword, wherein the hard bit codeword is stored into a hard bit buffer area, wherein a plurality of target memory cells of the target physical page are configured to store a plurality of target bit values of the target codeword, respectively,
wherein the error checking and correcting circuit is further configured to perform an iterative decoding operation on the hard bit codeword to obtain a decoded hard bit codeword corresponding to the hard bit codeword and a hard bit syndrome corresponding to the decoded hard bit codeword, wherein in response to determining that the hard bit syndrome is a smallest syndrome, the decoded hard bit codeword and the hard bit syndrome are stored into a trust buffer area of the read assisting circuit unit by the error checking and correcting circuit to become a trust codeword and a trust syndrome,
in response to the plurality of bit values of the trust syndrome not all being zero, the read operation further comprises operations in which:
the read assisting circuit unit is configured to use a left preset read voltage set and a right preset read voltage set corresponding to the preset read voltage to read the target codeword to obtain a left bit codeword, a right bit codeword, and a soft bit codeword corresponding to the left bit codeword and the right bit codeword, respectively, wherein the soft bit codeword is stored into a soft bit buffer area of the read assisting circuit unit,
wherein the error checking and correcting circuit is configured to perform the iterative decoding operation on each of the left bit codeword and the right bit codeword to obtain a decoded left bit codeword corresponding to the left bit codeword, a left bit syndrome corresponding to the decoded left bit codeword, a decoded right bit codeword corresponding to the right bit codeword and a right bit syndrome corresponding to the decoded right bit codeword,
wherein the read assisting circuit unit is configured to use the hard bit codeword and the soft bit codeword to compose soft information corresponding to the target codeword, and use the soft information and the trust codeword to perform a calibration on a log-likelihood ratio table of the iterative decoding operation, so as to update the log-likelihood ratio table into a calibrated log-likelihood ratio table, wherein the error checking and correcting circuit is further configured to perform the iterative decoding operation on the soft information according to the calibrated log-likelihood ratio table to obtain a final decoded codeword corresponding to the read operation and thereby complete the read operation, wherein a plurality of bit values of the final decoded codeword are configured to represent the plurality of target bit values of the stored target codeword.

10. The storage controller according to claim 9, wherein in response to determining that the left bit syndrome is the smallest syndrome, the error checking and correcting circuit stores the decoded left bit codeword and the left bit syndrome into the trust buffer area to update the trust codeword and the trust syndrome, wherein in response to determining that the right bit syndrome is the smallest syndrome, the error checking and correcting circuit stores the decoded right bit codeword and the right bit syndrome into the trust buffer area to update the trust codeword and the trust syndrome.

11. The storage controller according to claim 10, wherein in response to a plurality of bit values of the trust syndrome all being zero, the read assisting circuit unit uses the trust codeword as the final decoded codeword corresponding to the read operation to thereby complete the read operation.

12. The storage controller according to claim 9, wherein after obtaining the final decoded codeword, the read assisting circuit unit uses the soft information and the final decoded codeword to perform the calibration again on the log-likelihood ratio table of the iterative decoding operation, so as to update the calibrated log-likelihood ratio table of the iterative decoding operation again.

13. The storage controller according to claim 9, wherein after updating the calibrated log-likelihood ratio table, the error checking and correcting circuit performs the operation of performing the iterative decoding operation on the soft information to obtain the decoded hard bit codeword corresponding to the hard bit codeword and the hard bit syndrome corresponding to the decoded hard bit codeword again according to the calibrated log-likelihood ratio table.

14. The storage controller according to claim 9, wherein a voltage value of the left preset read voltage corresponding to the preset read voltage is a voltage value of the preset read voltage minus a first preset voltage offset, wherein a voltage value of the right preset read voltage corresponding to the preset read voltage is the voltage value of the preset read voltage plus a second preset voltage offset.

15. The storage controller according to claim 14, wherein the first preset voltage offset is equal to the second preset voltage offset.

16. The storage controller according to claim 15, wherein in the operation where the read assisting circuit unit is configured to use the left preset read voltage set and the right preset read voltage set corresponding to the preset read voltage to read the target codeword to obtain the left bit codeword, the right bit codeword, and the soft bit codeword corresponding to the left bit codeword and the right bit codeword, respectively, the read assisting circuit unit uses a left preset read voltage of the left preset read voltage set to read the target codeword stored by the target physical page to obtain a left bit value of each of the plurality of target memory cells, wherein the left bit values of the plurality of target memory cells compose the left bit codeword, wherein the read assisting circuit unit uses a right preset read voltage of the right preset read voltage set to read the target codeword stored by the target physical page to obtain a right bit value of each of the plurality of target memory cells, wherein the right bit values of the plurality of target memory cells compose the right bit codeword, wherein the read assisting circuit unit performs an XOR operation or an XNOR operation on the left bit value and the right bit value of each of the plurality of target memory cells, and using a first operation result corresponding to the XOR operation or a second operation corresponding to the XNOR operation as a soft bit value of each of the plurality of target memory cells, wherein the soft bit values of the plurality of target memory cells compose the soft bit codeword.

17. A storage device, the storage device comprising:

a rewritable non-volatile memory module, wherein the rewritable non-volatile memory module has a plurality of word lines, wherein each of the word lines is coupled to a plurality of memory cells, wherein each memory cell among the memory cells comprises a plurality of physical pages, and each physical page among the physical pages is configured to be programmed as a bit value;

a memory interface control circuit, configured to couple to the rewritable non-volatile memory module; and a processor, coupled to the memory interface control circuit, wherein the processor loads in and execute a read assisting program code module to realize a data reading method, and the data reading method comprises steps of:

using a preset read voltage to perform a read operation on a target codeword stored by a target physical page of a target word line to obtain a hard bit codeword, wherein the hard bit codeword is stored into a hard bit buffer area, wherein a plurality of target memory cells of the target physical page are configured to store a plurality of target bit values of the target codeword, respectively, wherein the target word line is selected from the plurality of word lines of the rewritable non-volatile memory module;

performing an iterative decoding operation on the hard bit codeword to obtain a decoded hard bit codeword corresponding to the hard bit codeword and a hard bit syndrome corresponding to the decoded hard bit codeword, wherein in response to determining that the hard bit syndrome is a smallest syndrome, the decoded hard bit codeword and the hard bit syndrome are stored into a trust buffer area to become a trust codeword and a trust syndrome;

in response to a plurality of bit values of the trust syndrome not all being zero, performing steps of:

using a left preset read voltage set and a right preset read voltage set corresponding to the preset read voltage to read the target codeword to obtain a left bit codeword, a right bit codeword, and a soft bit codeword corresponding to the left bit codeword and the right bit codeword, respectively, wherein the soft bit codeword is stored into a soft bit buffer area;

performing the iterative decoding operation on each of the left bit codeword and the right bit codeword to obtain a decoded left bit codeword corresponding to the left bit codeword, a left bit syndrome corresponding to the decoded left bit codeword, a decoded right bit codeword corresponding to the right bit codeword and a right bit syndrome corresponding to the decoded right bit codeword, using the hard bit codeword and the soft bit codeword to compose soft information corresponding to the target codeword, and using the soft information and the trust codeword to perform a calibration on a log-likelihood ratio table of the iterative decoding operation, so as to update the log-likelihood ratio table into a calibrated log-likelihood ratio table; and performing the iterative decoding operation on the soft information according to the calibrated log-likelihood ratio table to obtain a final decoded codeword corresponding to the read operation and thereby complete the read operation, wherein a plurality of bit values of the final decoded codeword are configured to represent the plurality of target bit values of the stored target codeword.

\* \* \* \* \*